United States Patent
Nishiyama et al.

(10) Patent No.: US 9,745,411 B2
(45) Date of Patent: Aug. 29, 2017

(54) RESIN COMPOSITION, RESIN SHEET, CURED RESIN SHEET, RESIN SHEET STRUCTURE, CURED RESIN SHEET STRUCTURE, METHOD FOR PRODUCING CURED RESIN SHEET STRUCTURE, SEMICONDUCTOR DEVICE, AND LED DEVICE

(71) Applicant: HITACHI CHEMICAL COMPANY, LTD., Tokyo (JP)

(72) Inventors: Tomoo Nishiyama, Tokyo (JP); Shigemitsu Yoshie, Tokyo (JP); Naoki Hara, Tokyo (JP); Kazumasa Fukuda, Tokyo (JP); Atsushi Kuwano, Tokyo (JP); Yasuo Miyazaki, Tokyo (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 14/392,191

(22) PCT Filed: Jun. 26, 2014

(86) PCT No.: PCT/JP2014/067055
§ 371 (c)(1),
(2) Date: Dec. 23, 2015

(87) PCT Pub. No.: WO2014/208694
PCT Pub. Date: Dec. 31, 2014

(65) Prior Publication Data
US 2016/0177024 A1    Jun. 23, 2016

(30) Foreign Application Priority Data
Jun. 27, 2013 (JP) .................................. 2013-134992

(51) Int. Cl.
*C08G 59/62* (2006.01)
*C08L 63/00* (2006.01)
(Continued)

(52) U.S. Cl.
CPC .......... *C08G 59/621* (2013.01); *B32B 15/092* (2013.01); *B32B 27/08* (2013.01);
(Continued)

(58) Field of Classification Search
CPC ..................................................... C08G 59/62
(Continued)

(56) References Cited

U.S. PATENT DOCUMENTS

| 2012/0251830 A1* | 10/2012 | Nishiyama | B32B 15/08 428/418 |
| 2013/0189514 A1* | 7/2013 | Nishiyama | H01L 23/145 428/323 |

FOREIGN PATENT DOCUMENTS

| CN | 102959005 A | 3/2013 |
| JP | 2001-055425 A | 2/2001 |

(Continued)

OTHER PUBLICATIONS

International Search Report for PCT/JP2014/067055 mailed Sep. 16, 2014; English translation submitted herewith (5 pages).
(Continued)

*Primary Examiner* — Kenneth Parker
*Assistant Examiner* — Warren H Kilpatrick
(74) *Attorney, Agent, or Firm* — Fitch, Even, Tabin & Flannery, LLP

(57) ABSTRACT

A resin composition including an epoxy resin monomer, a novolac resin including a compound having a structural unit represented by Formula (I), and a filler; in which the filler has at least 4 peaks in a particle size distribution measured
(Continued)

by laser diffractometry, in which four of the peaks are present respectively in ranges of not less than 0.01 μm and less than 1 μm, not less than 1 μm and less than 10 μm, from 10 μm to 50 μm, and from 20 μm to 100 μm, and in which a peak present in a range of from 10 μm to 50 μm includes an aluminum oxide particle, and a peak present in a range of from 20 μm to 100 μm includes a boron nitride particle. In Formula (I) each of $R^1$, $R^2$ and $R^3$ independently represents a hydrogen atom, an alkyl group, or the like. m represents 0 to 2, and n represents 1 to 7.

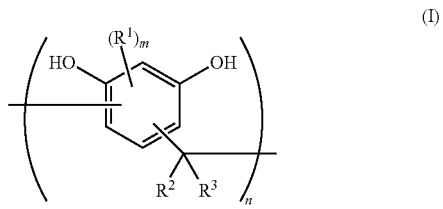

(I)

16 Claims, 7 Drawing Sheets

(51) Int. Cl.
| | | |
|---|---|---|
| H01L 23/29 | (2006.01) | |
| C08L 63/04 | (2006.01) | |
| B32B 15/092 | (2006.01) | |
| B32B 27/08 | (2006.01) | |
| B32B 27/38 | (2006.01) | |
| B32B 37/06 | (2006.01) | |
| C08J 5/18 | (2006.01) | |
| H01L 33/56 | (2010.01) | |
| C08K 3/22 | (2006.01) | |
| C08K 3/38 | (2006.01) | |

(52) U.S. Cl.
CPC .............. *B32B 27/38* (2013.01); *B32B 37/06* (2013.01); *C08J 5/18* (2013.01); *C08L 63/00* (2013.01); *C08L 63/04* (2013.01); *H01L 23/295* (2013.01); *H01L 33/56* (2013.01); *B32B 2305/72* (2013.01); *B32B 2311/00* (2013.01); *B32B 2363/00* (2013.01); *B32B 2457/20* (2013.01); *C08J 2363/04* (2013.01); *C08K 2003/2227* (2013.01); *C08K 2003/385* (2013.01); *C08K 2201/003* (2013.01); *C08L 2203/206* (2013.01); *H01L 2224/48091* (2013.01); *H01L 2224/73265* (2013.01); *H01L 2924/0002* (2013.01); *H01L 2924/13055* (2013.01)

(58) Field of Classification Search
USPC ......................................................... 257/100
See application file for complete search history.

(56) References Cited

FOREIGN PATENT DOCUMENTS

| | | | |
|---|---|---|---|
| JP | 2001-348488 A | 12/2001 | |
| JP | 2008-013759 A | 1/2008 | |
| JP | 2008-189818 A | 8/2008 | |
| JP | WO 2011/040416 A1 * | 4/2011 | .............. C08L 63/00 |
| JP | 2012-031401 A | 2/2012 | |
| JP | WO 2012/046814 A1 * | 4/2012 | .............. H01B 7/42 |
| JP | 2013-014670 A | 1/2013 | |
| TW | 201215583 A | 4/2012 | |
| TW | 201219211 A | 5/2012 | |
| WO | 2012/002505 A1 | 1/2012 | |
| WO | 2012/046814 A1 | 4/2012 | |
| WO | 2013/065159 A1 | 5/2013 | |

OTHER PUBLICATIONS

Written Opinion of the International Searching Authority mailed Sep. 16, 2014 (3 pages).
Office Action of CN Appln. No. 201480036182.6 dated Jan. 25, 2017 with English translation.

* cited by examiner

RESIN COMPOSITION, RESIN SHEET, CURED RESIN SHEET, RESIN SHEET STRUCTURE, CURED RESIN SHEET STRUCTURE, METHOD FOR PRODUCING CURED RESIN SHEET STRUCTURE, SEMICONDUCTOR DEVICE, AND LED DEVICE

TECHNICAL FIELD

The present invention relates to a resin composition, a resin sheet, a cured resin sheet, a resin sheet structure, a cured resin sheet structure, a method for producing a cured resin sheet structure, a semiconductor device, and an LED device.

BACKGROUND ART

Accompanying progress of downsizing, capacity increase, performance improvement and the like in electronic devices using semiconductors, the heat amount generated from the semiconductors mounted at a high density has been growing. For example, for stable operation of a central processing unit of a personal computer, or a semiconductor device used for regulating a motor of an electric car, a heat sink or a heat dissipation fin is indispensable for heat dissipation, and as a connecting member between a semiconductor device and a heat sink, etc., a material, which can achieve both high insulating properties and thermal conductivity, has been demanded.

In general, as an insulating material used for a printed-circuit board mounting a semiconductor device or the like, organic materials are broadly used. Although such organic materials have highly insulating properties, their thermal conductivity is low and they contribute little to heat dissipation of a semiconductor device or the like. Meanwhile, in some cases, an inorganic material such as an inorganic ceramic is used for heat dissipation of a semiconductor device or the like. Although thermal conductivity of such an inorganic material is high, the insulating properties is not sufficient compared to an organic material, and a material which can achieve both high insulating properties and thermal conductivity has been demanded.

In this connection, various materials, in which an inorganic filler with high thermal conductivity called as a filler is compounded in a resin, have been investigated. For example, an epoxy resin composition, which has a low melt viscosity and is able to compound a filler at a high concentration, has been known (for example, refer to Japanese Patent Application Laid-Open (JP-A) No. 2001-055425). Further, a cured resin composed of a composite system of a general bisphenol A epoxy resin and an alumina filler has been known, which can allegedly attain a thermal conductivity coefficient of 3.8 W/mK by a xenon flash lamp method and 4.5 W/mK by a temperature wave analysis method (for example, refer to JP-A No. 2008-013759). Similarly, a cured resin composed of a composite system of a special epoxy resin, an amine curing agent, and an alumina filler has been known, which can allegedly attain a thermal conductivity coefficient of 9.4 W/mK by a xenon flash lamp method and 10.4 W/mK by a temperature wave analysis method (for example, refer to JP-A No. 2008-013759).

Further, as a cured thermosetting resin superior in thermal conductivity, a cured resin of a thermally conductive resin composition containing boron nitride and polymer ingredients, such as an epoxy resin, an amine curing agent, and a curing catalyst, has been disclosed, which can allegedly attain a thermal conductivity coefficient of from 6 W/mK to 11 W/mK by a temperature wave analysis method (for example, refer to JP-A No. 2008-189818).

SUMMARY OF INVENTION

Technical Problem

However, with cured resins according to JP-A No. 2001-055425, JP-A No. 2008-013759, and JP-A No. 2008-189818, there are cases in which it is difficult to achieve both thermal conductivity and adhesive strength with an adherend at a high level. In particular, when a phenolic compound is used as a curing agent, the viscosity of a resin composition tends to become high, and therefore, there are cases in which it is necessary to increase a pressing pressure during curing in order to obtain a sufficient adhesive strength with an adherend.

The present invention aims to provide a cured resin sheet superior in both thermal conductivity and adhesive strength with an adherend, as well as a resin sheet and a resin composition, which can form the cured resin sheet. Furthermore, the present invention aims to provide a resin sheet structure to be constituted with the resin sheet, a cured resin sheet structure, a method for producing a cured resin sheet structure, a semiconductor device, and an LED device.

Solution to Problem

Specific means for achieving the objects are as follows.

<1> A resin composition including an epoxy resin monomer, a novolac resin including a compound having a structural unit represented by the following Formula (I), and a filler;

in which the filler has at least 4 peaks in a particle size distribution measured by laser diffractometry, in which four of the peaks are present respectively in ranges of not less than 0.01 μm and less than 1 μm, not less than 1 μm and less than 10 μm, from 10 μm to 50 μm, and from 20 μm to 100 μm, and in which a peak present in a range of from 10 μm to 50 μm includes an aluminum oxide particle, and a peak present in a range of from 20 μm to 100 μm includes a boron nitride particle.

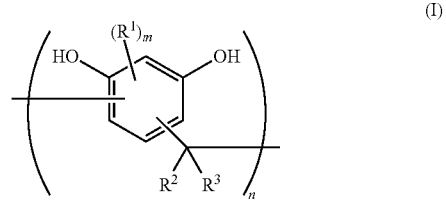

In Formula (I), $R^1$ represents an alkyl group, an aryl group or an aralkyl group; each of $R^2$ and $R^3$ independently represents a hydrogen atom, an alkyl group, an aryl group or an aralkyl group; m represents a number from 0 to 2; n represents a number from 1 to 7; and in a case in which m is 2, the two $R^1$s may be the same or different.

<2> A resin composition including an epoxy resin monomer, a novolac resin including a compound having a structural unit represented by the following Formula (I), and a filler;
in which the filler includes:
a first filler having a volume average particle diameter of not less than 0.01 μm and less than 1 μm;
a second filler having a volume average particle diameter of not less than 1 μm and less than 10 μm;

a third filler having a volume average particle diameter of from 10 μm to 50 μm, and containing an aluminum oxide particle; and a fourth filler having a volume average particle diameter of from 20 μm to 100 μm, and containing a boron nitride particle.

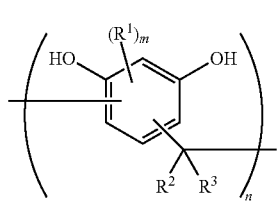

In Formula (I), $R^1$ represents an alkyl group, an aryl group or an aralkyl group; each of $R^2$ and $R^3$ independently represents a hydrogen atom, an alkyl group, an aryl group or an aralkyl group; m represents a number from 0 to 2; n represents a number from 1 to 7; and in a case in which m is 2, the two Ws may be the same or different.

<3> The resin composition according to <2>, in which a total content of the third filler and the fourth filler is from 60% by volume to 98% by volume of a total volume of the fillers.

<4> The resin composition according to <2> or <3>, in which a volume ratio of a content of the fourth filler to a content of the third filler is from 0.1 to 5.

<5> The resin composition according to any one of <1> to <4>, in which a content of the boron nitride particle is from 30% by volume to 90% by volume with respect to a total volume of the fillers.

<6> The resin composition according to any one of <1> to <5>, in which the novolac resin includes a phenolic compound constituting the novolac resin, and a content of the phenolic compound is from 5% by mass to 50% by mass.

<7> The resin composition according to any one of <1> to <6>, in which the novolac resin further contains a compound having a structural unit represented by the following Formula (II).

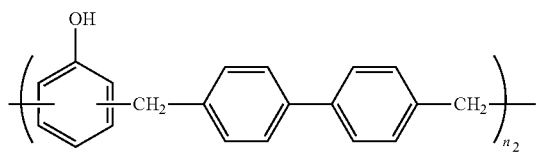

In Formula (II), $n_2$ represents a number from 1 to 10.

<8> A resin sheet which is a sheet-shaped product formed from the resin composition according to any one of <1> to <7>, the resin sheet having an average thickness of from 40 μm to 250 μm.

<9> The resin sheet according to <8>, the resin sheet being a layered product of a first resin layer formed from the resin composition according to any one of <1> to <7>, and a second resin layer formed from the resin composition according to any one of <1> to <7>.

<10> The resin sheet according to <9>, further including a metallic foil on or above one face of the layered product, and a protective film on or above another face of the layered product.

<11> A cured resin sheet, the cured resin sheet being a heat-treated product of the resin sheet according to any one of <8> to <10>.

<12> A resin sheet structure including the resin sheet according to <8> or <9>, and a metal plate or a radiator plate placed on or above at least one face of the resin sheet.

<13> A cured resin sheet structure, the cured resin sheet structure being a heat-treated product of the resin sheet structure according to <12>.

<14> A method for producing a cured resin sheet structure, the method including:

producing a resin sheet structure by placing a metal plate or a radiator plate on or above at least one face of the resin sheet according to <8> or <9>; and curing the resin sheet by heating the resin sheet structure.

<15> A semiconductor device, including:

a semiconductor element; and the cured resin sheet according to <11> placed on the semiconductor element.

<16> An LED device, including an LED element, the cured resin sheet according to claim 11 and a substrate, layered in this order.

Advantageous Effects of Invention

In the present invention, it is possible to provide a cured resin sheet superior in both thermal conductivity and adhesive strength with an adherend, as well as a resin sheet and a resin composition, which can form the cured resin sheet. Further, in the present invention, it is possible to provide a resin sheet structure to be constituted with the resin sheet, a cured resin sheet structure, a method for producing a cured resin sheet structure, a semiconductor device, and an LED device.

DESCRIPTION OF EMBODIMENTS

Figure 1:
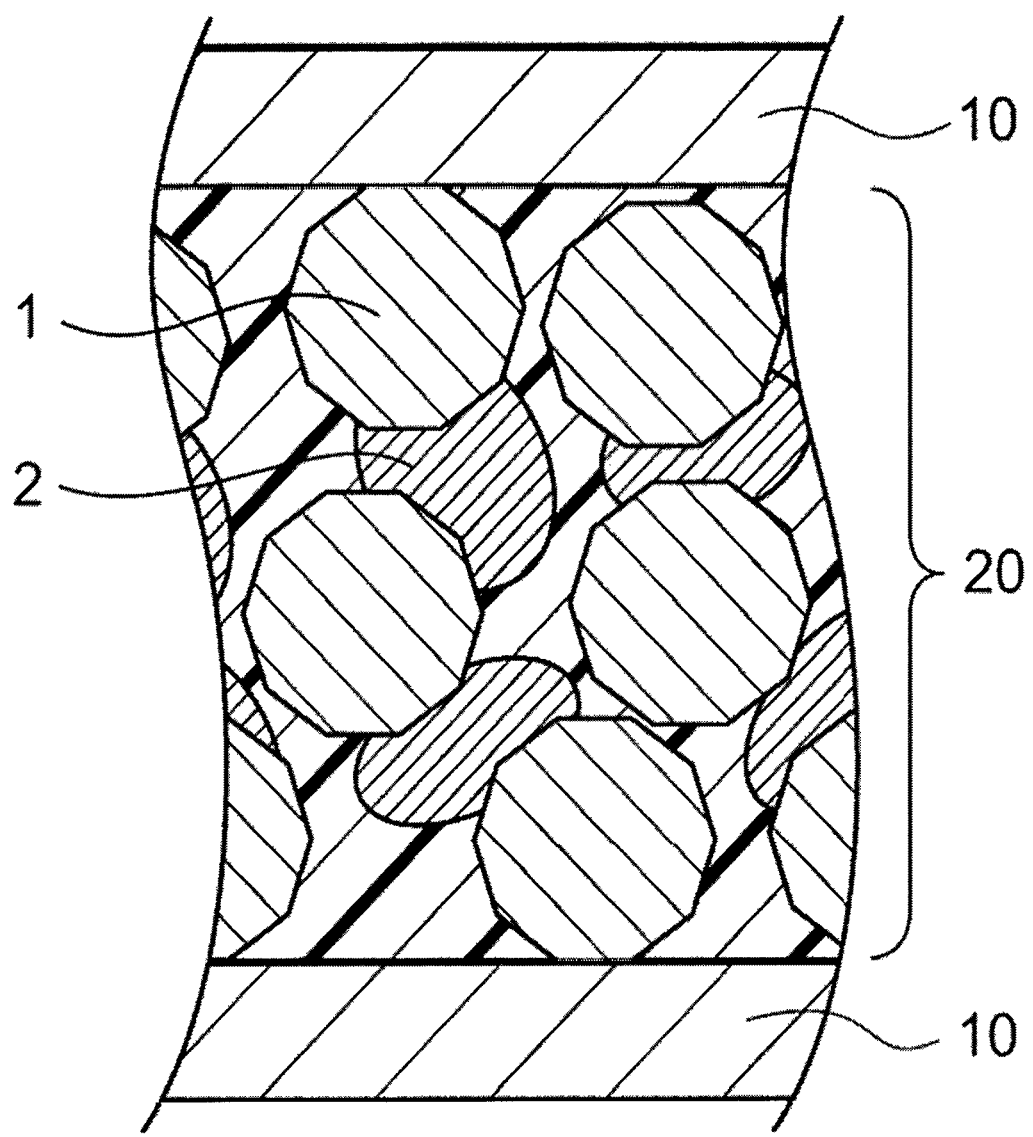
FIG. 1 is a schematic cross-sectional view showing an example of a filler distribution in a cured resin sheet in the present invention.

In the present specification, the term "process" includes herein not only an independent process, but also a process which may not be clearly distinguishable from another process, insofar as an intended function of the process can be attained. A numerical value range expressed as "x to y" includes herein the values of x and y in the range as the minimum and maximum values, respectively. In referring herein to a content of each component in a composition, when plural kinds of substances exist corresponding to a component in the composition, the content means, unless otherwise specified, the total amount of the plural kinds of substances existing in the composition.

<Resin Composition>

A resin composition as the first aspect in the present invention contains an epoxy resin monomer, a novolac resin including a compound having a structural unit represented by the following Formula (I), and a filler; in which the filler has at least 4 peaks in a particle size distribution measured by laser diffractometry, in which four of the peaks are present respectively in ranges of not less than 0.01 μm and less than 1 μm, not less than 1 μm and less than 10 μm, from 10 μm to 50 μm, and from 20 μm to 100 μm, and in which a peak present in a range of from 10 μm to 50 μm includes an aluminum oxide particle, and a peak present in a range of from 20 μm to 100 μm includes a boron nitride particle. The resin composition may further contain, if necessary, another component.

A resin composition as the second aspect in the present invention contains an epoxy resin monomer, a novolac resin including a compound having a structural unit represented by the following Formula (I), and a filler; in which the filler includes: a first filler having a volume average particle diameter of not less than 0.01 μm and less than 1 μm; a second filler having a volume average particle diameter of not less than 1 μm and less than 10 μm; a third filler having a volume average particle diameter of from 10 μm to 50 μm, and containing an aluminum oxide particle; and a fourth filler having a volume average particle diameter of from 20 μm to 100 μm, and containing a boron nitride particle. The resin composition may further contain, if necessary, another component.

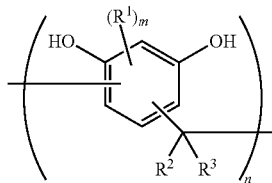

In Formula (I), $R^1$ represents an alkyl group, an aryl group, or an aralkyl group; each of $R^2$ and $R^3$ independently represents a hydrogen atom, an alkyl group, an aryl group, or an aralkyl group; m represents a number from 0 to 2; n represents a number from 1 to 7. In a case in which m is 2, the two $R^1$s may be the same or different.

A resin sheet containing a resin composition with such a constitution is superior in adhesion to a metal plate and a radiator plate before curing. Further, by heat-curing through a heat treatment of the resin sheet, a cured resin sheet superior in thermal conductivity and adhesive strength can be constituted. For example, the possible reason for this is as follows.

It is conceivable that a resin composition of the first aspect in the present invention exhibits superior adhesiveness before curing, because the resin composition contains in combination with an epoxy resin monomer and a novolac resin having a specific structural unit. Further, when the resin composition contains in combination with an epoxy resin monomer and a novolac resin having a specific structural unit is cured, adhesive strength and insulating properties are maintained. In addition, when a filler has at least 4 peaks in a particle size distribution measured by laser diffractometry, in which four of the peaks are present respectively in ranges of not less than 0.01 μm and less than 1 μm, not less than 1 μm and less than 10 μm, from 10 μm to 50 μm, and from 20 μm to 100 μm, and in which a peak present in a range of from 10 μm to 50 μm includes an aluminum oxide particle, and a peak present in a range of from 20 μm to 100 μm includes a boron nitride particle, particularly superior thermal conductivity can be exhibited, presumably because a heat conduction path (details will be described below) is efficiently formed during curing by a heat treatment owing to a heat conduction path forming effect attributable to a combination of the filler.

Further, it is conceivable that a resin composition of the second aspect in the present invention exhibits superior adhesiveness before curing, because the resin composition contains in combination with an epoxy resin monomer and a novolac resin having a specific structural unit. Further, when the resin composition contains in combination with an epoxy resin monomer and a novolac resin having a specific structural unit is cured, adhesive strength and insulating properties are maintained. In addition, when the filler includes: a first filler having a volume average particle diameter of not less than 0.01 μm and less than 1 μm; a second filler having a volume average particle diameter of not less than 1 μm and less than 10 μm; a third filler having a volume average particle diameter of from 10 μm to 50 μm, and containing an aluminum oxide particle; and a fourth filler having a volume average particle diameter of from 20 μm to 100 μm, and containing a boron nitride particle, particularly superior thermal conductivity can be exhibited, presumably because a heat conduction path is efficiently formed during curing by a heat treatment owing to a heat conduction path forming effect attributable to a combination of the fillers.

The filler in the resin composition of the first aspect may be composed, for example, by containing the first filler, the second filler, the third filler and the fourth filler of the resin composition of the second aspect. Therefore, an appearance of thermal conductivity in a resin composition of the first aspect and a resin composition of the second aspect will be further described by way of the first filler, the second filler, the third filler, and the fourth filler.

The Mohs hardness of boron nitride is 2, which is lower, namely softer, compared to other insulating ceramics, such as aluminum oxide (alumina, Mohs hardness 9) and aluminum nitride (Mohs hardness 7). Further, boron nitride having a spherical or roundish particle shape is in a form of an agglomerated particle of primary particles, voids are present inside the agglomerated particle, and therefore, the agglomerated particle itself, although it is harder than a molten resin, can easily change its shape.

As the result, a boron nitride particle having a relatively large particle size in a resin sheet is deformable during a hot-pressing process, a layering process, and a pressing process, which are described below, and displaces a resin present among fillers during deformation so that the fillers can easily approach each other. For example, when the fourth filler containing a boron nitride particle is present among the third filler having a volume average particle diameter of from 10 μm to 50 μm and containing an aluminum oxide particle, a boron nitride particle can be packed by deforming between hard aluminum oxide particles. As a result, it can be considered that it becomes easy for a structure in which fillers contact continuously in the thickness direction of a resin sheet and a cured resin sheet (also called a "heat conduction path") to be formed so that a thermal conductivity coefficient is improved.

Similar phenomena can occur between fillers of any particle size ranges, such as between the first filler and the fourth filler, the second filler and the fourth filler, the third filler and the fourth filler, and the fourth fillers themselves. By packing around a boron nitride particle having a relatively large particle size with fillers having a relatively small particle size, the filling rate can be enhanced, and it becomes easy for a thicker heat conduction path, so that thermal conductivity coefficient can be improved.

Although an aluminum nitride particle is known as a filler having thermal conductivity higher than a boron nitride particle, the particle is hard and not able to deform easily, so that a heat conduction path is hardly formed. Therefore, it is conceived that a thermal conductivity improvement effect of an aluminum nitride particle is weaker than that of a boron nitride particle.

Figure 2:
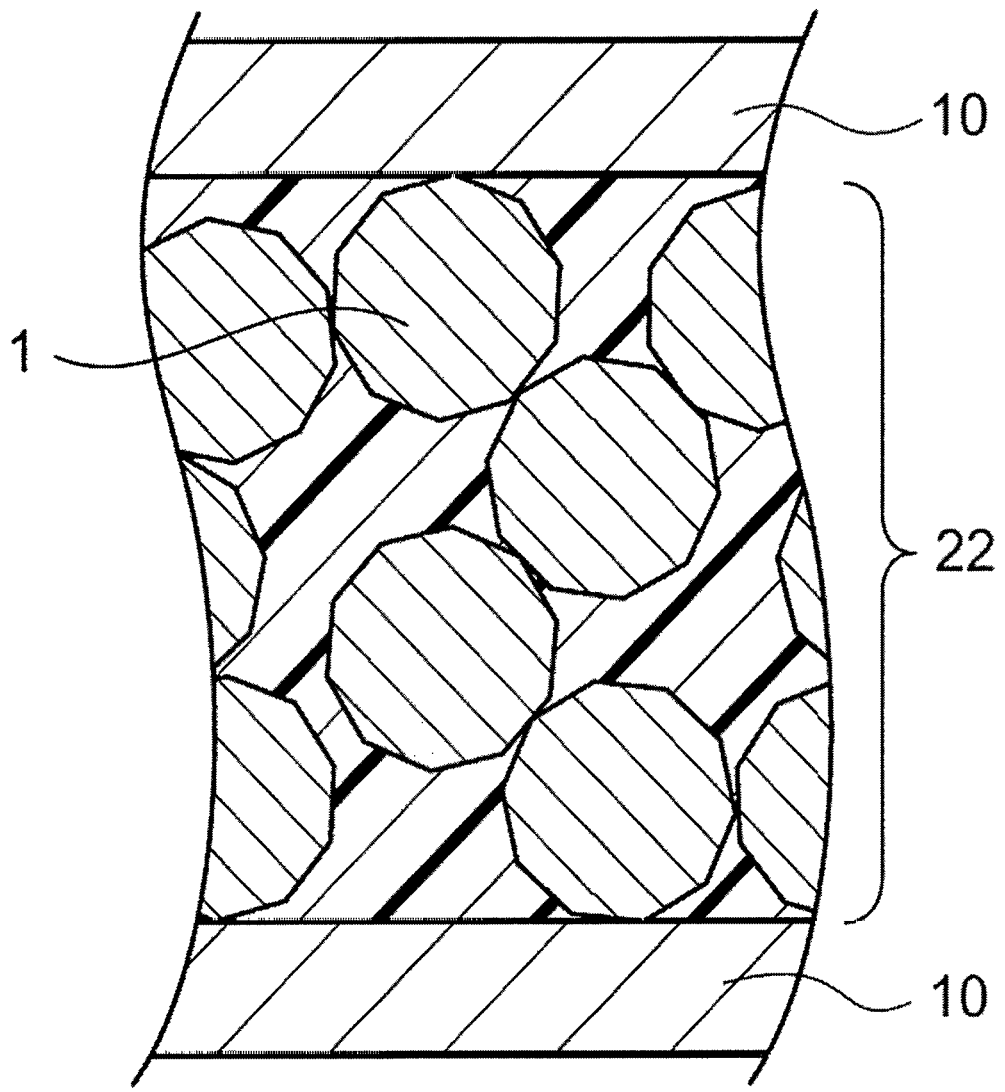
FIG. 2 is a schematic cross-sectional view showing an example of a filler distribution in a comparative cured resin sheet.
Figure 3:
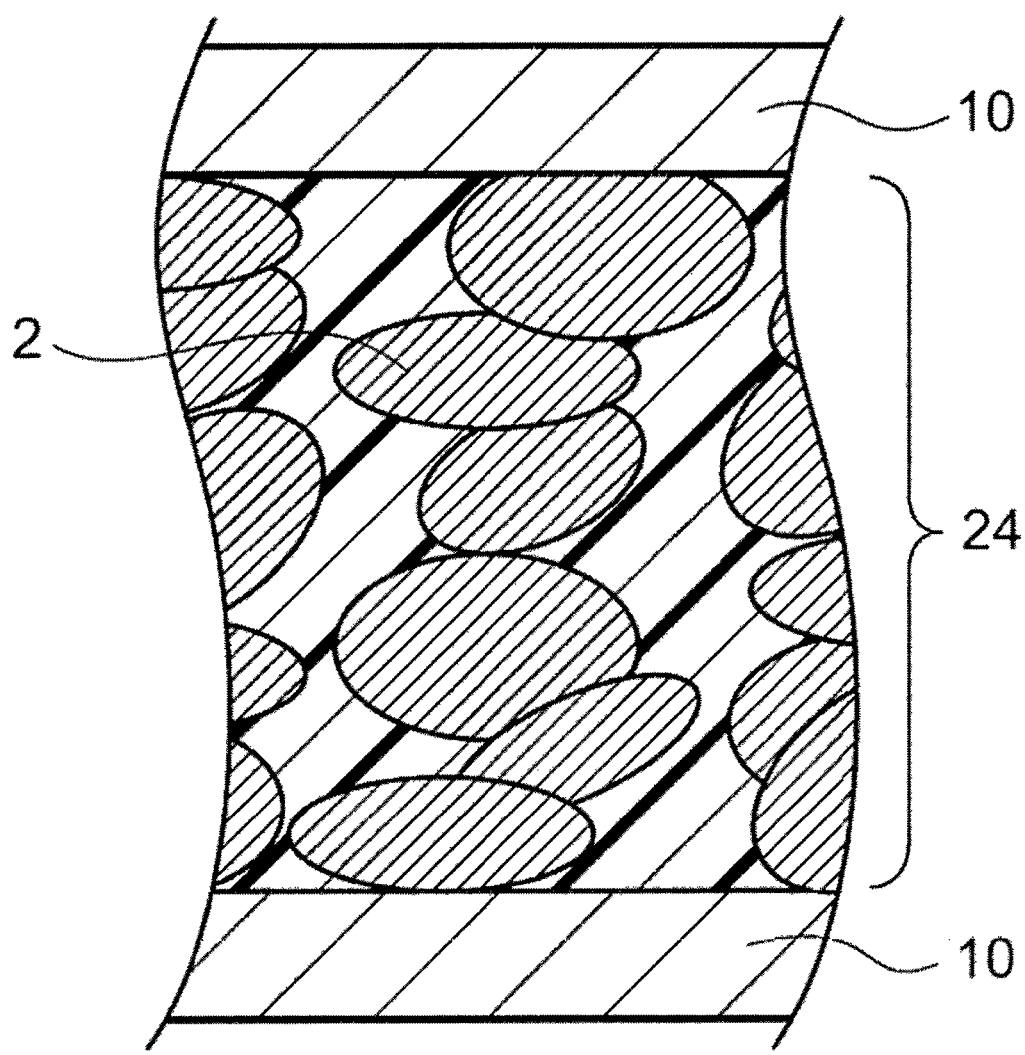
FIG. 3 is a schematic cross-sectional view showing another example of a filler distribution in a comparative cured resin sheet.

Such a heat conduction path forming effect will be described referring to drawings. FIG. 1, FIG. 2, and FIG. 3 are cross-sectional views showing conceptually a formation state of a heat conduction path in a cured resin sheet. The figures show schematically a distribution of fillers, and for the sake of simplicity illustration of the first filler and the second filler is omitted and only the third filler 1 and the fourth filler 2 are illustrated.

FIG. 1 is a schematic cross-sectional view showing a formation state of a heat conduction path in a cured resin sheet 20 in the present invention placed between two metal substrates 10. In FIG. 1 among a plurality of third fillers 1, fourth fillers 2 are placed while deforming along the outlines of the shape of the third filler 1. Although the third filler 1 is not deformed easily, because a hard aluminum oxide particle is contained, the fourth filler 2 contains a boron nitride particle, which can be deformed easily, and a heat conduction path is formed by the third filler 1 and the fourth filler 2 deformed along the outlines of the shape of the third filler 1.

It is conceived that through such a heat conduction path formed in a cured resin sheet 20 placed in contact with two metal substrates 10, thermal conductivity between the two metal substrates 10 can be superior, and the two metal substrates 10 can be bonded firmly through the cured resin sheet 20.

FIG. 2 is a schematic cross-sectional view showing a formation state of a heat conduction path in a cured resin sheet 22 having a comparative constitution placed between two metal substrates 10. A cured resin sheet 22 does not contain the fourth filler, but contains the first filler (not illustrated), the second filler (not illustrated), and the third filler 1. In FIG. 2 a plurality of third fillers 1 are placed dispersedly. Since the third filler 1 contains a hard aluminum oxide particle, it is not easily deformed, and consequently, a plurality of the third fillers 1 do not contact each other easily, and as the result an efficient heat conduction path is not formed. It is conceived, therefore, that sufficient thermal conductivity cannot be obtained between the two metal substrates 10.

FIG. 3 is a schematic cross-sectional view showing a formation state of a heat conduction path in a cured resin sheet 24 having a comparative constitution placed between two metal substrates 10. The cured resin sheet 24 does not contain the third filler, but contains the first filler (not illustrated), the second filler (not illustrated), and the fourth filler 2. In FIG. 3 a plurality of fourth fillers 2 are deformed remarkably and contacted each other. Since the fourth filler 2 contains an easily deformable boron nitride particle, the filler is deformed also in a direction perpendicular to a pressing direction for adhesion. Therefore, for forming a heat conduction path, it is required to apply a high pressure. Further, for forming sufficient heat conduction paths, it is required that a larger amount of the fourth filler 2 is added in a cured resin sheet 24 compared to a case in which a hard aluminum oxide particle is used. Therefore, in the case of the cured resin sheet 24 shown in FIG. 3, there are conceivably practical drawbacks in that it is necessary to add a larger amount of fourth filler 2 compared to a case in which the third filler containing an aluminum oxide particle is contained, and that a higher pressure is necessary.

(Filler)

The resin composition contains a filler that has at least 4 peaks in a particle size distribution measured by laser diffractometry. The filler has at least 4 peaks in a particle size distribution measured by laser diffractometry, in which four of the peaks are present respectively in ranges of not less than 0.01 μm and less than 1 μm, not less than 1 μm and less than 10 μm, from 10 μm to 50 μm, and from 20 μm to 100 μm, and in which a peak present in a range of from 10 μm to 50 μm includes an aluminum oxide particle, and a peak present in a range of from 20 μm to 100 μm includes a boron nitride particle.

The filler having such a particle size distribution can be constituted, for example, by combining at least four kinds of fillers having a single peak in a particle size distribution. Specifically, the filler can be constituted by containing, for example, the first filler having a volume average particle diameter of not less than 0.01 μm and less than 1 μm, the second filler having a volume average particle diameter of not less than 1 μm and less than 10 μm, the third filler having a volume average particle diameter of from 10 μm to 50 μm and containing an aluminum oxide particle, and the fourth filler having a volume average particle diameter of from 20 μm to 100 μm and containing a boron nitride particle. Further, the filler may be constituted by combining a plurality of fillers having two or more peaks in a particle size distribution. When the particle size distribution of the filler has such a structure, the filling rate of a filler in a cured resin sheet is enhanced, and the thermal conductivity of a cured resin sheet is enhanced more efficiently.

In this regard, the volume average particle diameter of a filler is determined as a particle diameter corresponding to the cumulative volume of 50% counted from the small particle diameter side in a particle size distribution measured by a laser diffraction scattering method.

The volume average particle diameter of the first filler is not less than 0.01 μm and less than 1 μm, preferably from 0.05 μm to 0.8 μm from a viewpoint of dispersibility, and more preferably from 0.1 μm to 0.6 μm from a viewpoint of packability.

The volume average particle diameter of the second filler is not less than 1 μm and less than 10 μm, preferably from 1.2 μm to 8 μm from a viewpoint of resin melt viscosity, and more preferably from 1.4 μm to 6 μm from a viewpoint of packability.

A content of the first filler with respect to a total volume of the fillers is preferably from 1% by volume to 15% by volume, more preferably from 3% by volume to 14% by volume, and further preferably from 5% by volume to 13% by volume.

A content of the second filler with respect to a total volume of the fillers is preferably from 5% by volume to 25% by volume, more preferably from 8% by volume to 23% by volume, and further preferably from 10% by volume to 21% by volume.

There is no particular restriction on a material for the first filler and the second filler, insofar as it is an inorganic compound particle having insulating properties. The inorganic compound particle should preferably have high thermal conductivity. Specific examples of the first filler and the second filler include inorganic compound particles, such as aluminum oxide, a hydrate of aluminum oxide, magnesium oxide, boron nitride, aluminum nitride, silicon nitride, talc, mica, aluminum hydroxide, and barium sulfate. Among others, from viewpoints of thermal conductivity and insulating properties, at least one kind of inorganic compound particle selected from the group consisting of aluminum oxide, boron nitride, and aluminum nitride. The first filler and the second filler may contain singly or a combination of two or more kinds.

There is no particular restriction on a particle shape of the first filler and the second filler, and examples of the same include spherical, roundish, cataclastic, scaly and agglomerated particle shapes. From viewpoints of packability and thermal conductivity, the particle shape of the first filler and the second filler are preferably spherical, roundish or agglomerated particle-shaped.

The volume average particle diameter of the third filler is from 10 μm to 50 μm, preferably from 12 μm to 48 μm from a viewpoint of filler packability, from a viewpoint of adhesiveness, more preferably from 14 μm to 45 μm, further preferably from 15 μm to 42 μm, still more preferably from 17 μm to 40 μm, and extremely preferably from 17 μm to 35 μm.

A content of the third filler with respect to a total volume of the fillers is preferably from 5% by volume to 40% by volume, more preferably from 8% by volume to 37% by volume, and further preferably from 10% by volume to 35% by volume.

The third filler contains an aluminum oxide particle. From a viewpoint of thermal conductivity, a content of an aluminum oxide particle in the third filler is preferably 5% by volume or more with respect to a total volume of the fillers, more preferably 8% by volume or more, and further preferably 10% by volume or more. From a viewpoint of a coefficient of thermal conductivity, a content of an aluminum oxide particle in the third filler is preferably 40% by volume or less with respect to a total volume of the fillers, more preferably 37% by volume or less, and further preferably 35% by volume or less.

There is no particular restriction on a particle shape of the third filler, and examples of the same include spherical, roundish, cataclastic, scaly and agglomerated particle shapes. From viewpoints of packability and thermal conductivity, the particle shape of the third filler is preferably spherical, roundish, or agglomerated particle-shaped.

Examples of a determining method for the shape of the third filler and the content of an aluminum oxide particle include a determining method from the ash content and a density of a resin composition or sheet, and a microscopic observation method of a sectional structure. For example, a resin in a sheet is degraded by heating, while the weight change before and after the heating is traced to calculate a content of the total fillers. Alternatively, by measuring the type and density of the fillers, a content of each filler can be determined. Alternatively, the same can be confirmed by determining the crystal form of a filler in a resin composition by observing a cross-section of a resin sheet or a cured product thereof with a SEM (scanning electron microscope), or alternatively, by analyzing qualitatively or quantitatively elements in the third filler using a SEM-EDX (energy dispersive X-ray spectrometer).

The third filler may further contain in addition to an aluminum oxide particle another inorganic compound particle having insulating properties. Examples of a material for an inorganic compound particle having insulating properties other than aluminum oxide, which the third filler may contain, include those similar to the first filler and the second filler (except aluminum oxide).

The volume average particle diameter of the fourth filler is from 20 μm to 100 μm, preferably from 24 μm to 85 μm from a viewpoint of filler packability, more preferably from 28 μm to 70 μm from a viewpoint of adhesiveness, further preferably from 32 μm to 65 μm, and still more preferably from 36 μm to 60 μm.

A content of the fourth filler with respect to a total volume of the fillers is preferably from 15% by volume to 90% by volume, more preferably from 15% by volume to 85% by volume, further preferably from 18% by volume to 85% by volume, still more preferably from 18% by volume to 80% by volume, and extremely preferably from 20% by volume to 75% by volume.

The fourth filler contains a boron nitride particle. From a viewpoint of thermal conductivity, a content of a boron nitride particle in the fourth filler is preferably 15% by volume or more with respect to a total volume of the fillers, more preferably 18% by volume or more, further preferably 20% by volume or more, and still more preferably 30% by volume or more. Meanwhile, from a viewpoint of adhesive strength, a content of a boron nitride particle in the fourth filler with respect to a total volume of the fillers is preferably 90% by volume or less, more preferably 85% by volume or less, further preferably 80% by volume or less, and still more preferably 75% by volume or less.

There is no particular restriction on a particle shape of the fourth filler, and examples of the same include spherical, roundish, cataclastic, and scaly shapes. Further, an agglomerated particle is also preferable for a boron nitride particle. From viewpoints of packability and thermal conductivity, the particle shape of the fourth filler is preferably spherical or roundish, and more preferably spherical or roundish agglomerated particle-shaped.

As an example of a method for determining the shape of the fourth filler and the content of a boron nitride particle, there is a method by which a structure in a resin composition or a sheet is observed with a microscope. The same can be confirmed, for example, by determining the crystal form of a filler in a resin composition by observing a cross-section of a resin sheet or a cured product thereof with a SEM (scanning electron microscope), or alternatively analyzing qualitatively or quantitatively elements in the filler using a SEM-EDX (energy dispersive X-ray spectrometer).

The fourth filler may further contain in addition to a boron nitride particle another inorganic compound particle having insulating properties. Examples of a material for an inorganic compound particle having insulating properties other than boron nitride, which the fourth filler may contain, include those similar to the first filler and the second filler (except boron nitride).

When the filler contains as described above four kinds of fillers having different volume average particle diameters, and among the four kinds of fillers a filler having a volume average particle diameter of from 10 μm to 50 μm contains an aluminum oxide particle, and a filler having a volume average particle diameter of from 20 μm to 100 μm contains a boron nitride particle, a particle size distribution can be exhibited by setting particle diameter to the abscissa, and frequency to the ordinate, and plotting the measured particle size distribution of the entire fillers contained in a resin composition, in which a peak is present in each of the ranges of particle diameter of not less than 0.01 μm and less than 1 μm, not less than 1 μm and less than 10 μm, from 10 μm to 50 μm, and from 20 μm to 100 μm, and further a peak present in a range of from 10 μm to 50 μm includes an aluminum oxide particle, and a peak present in a range of from 20 μm to 100 μm includes a boron nitride particle.

The particle size distribution of a filler can be measured by a laser diffraction scattering method. In a case in which a laser diffraction scattering method is used, a measurement can be performed by firstly extracting a filler from a resin composition, a resin sheet, a cured resin sheet or the like and using a laser diffraction scattering particle size distribution analyzer (for example, LS 230, produced by Beckman Coulter, Inc.). Specifically, firstly into a solvent (water) a filler in a range of from 1% by mass to 5% by mass is added together with from 0.01% by mass to 0.1% by mass of a dispersing agent (sodium hexametaphosphate) to prepare a sample liquid. The sample liquid is dispersed by sonication using an ultrasonic vibrator (grade number UT-106, output power 100 W, produced by Sharp Manufacturing Systems Corporation) at a temperature of 23° C., for from 3 min to 5 min. About 2 mL of the dispersed sample liquid is injected in a cell and the particle size distribution is measured by a laser diffraction particle size distribution analyzer at 25° C., where, for example, the refractive index of alumina is defined as 1.77, and the refractive index of boron nitride is defined as 2.17.

A filler contained in a resin composition, a resin sheet, a cured resin sheet or the like is extracted with an organic solvent, nitric acid, aqua regia or the like and dispersed thoroughly by an ultrasonic disperser or the like to prepare a dispersion liquid, then the particle size distribution is determined by measuring the particle size distribution of the dispersion liquid. Further, by calculating a volume of a particle swarm belonging to each peak in the filler particle size distribution, a volume content of a particle swarm belonging to each peak with respect to a total volume of the fillers can be calculated.

By observing a cross-section of a resin sheet or a cured product thereof with a scanning electron microscope, the particle size distribution of a filler can be measured. Specifically, the resin sheet or the cured product thereof is embedded in a transparent epoxy resin and polished by a polisher and slurry, ion milling, a FIB (focused ion beam) or the like to expose a cross-section of the resin sheet or the cured product thereof. The particle size distribution of the filler can be measured by observing the cross-section with a scanning electron microscope. Alternatively, the particle size distribution of a filler can be also measured by repeating polishing and two-dimensional cross-section observation using a FIB apparatus (focused ion beam SEM) or the like to perform a three-dimensional structural analysis. Further, by calculating a volume of a particle swarm belonging to each peak in the filler particle size distribution, a volume content of a particle swarm belonging to each peak with respect to a total volume of the fillers can be calculated.

Whether or not a peak containing an aluminum oxide particle is present in a range of from 10 μm to 50 μm in the particle size distribution, can be confirmed by a particle distribution diameter measurement by the FIB-SEM. Whether or not a peak containing a boron nitride particle is present in a range of from 20 μm to 100 μm in the particle size distribution, can be also confirmed by a particle distribution diameter measurement by the FIB-SEM. The above judgment is also possible by a measurement of a filler using a laser particle size distribution analyzer. An aluminum oxide particle and a boron nitride particle can be separated based on density difference.

In a case in which a filler is constituted as above and has a peak containing an aluminum oxide particle in a range of from 10 μm to 50 μm in the particle size distribution and a peak containing a boron nitride particle in a range of from 20 μm to 100 μm, the thermal conductivity in a cured resin composition is enhanced.

From viewpoints of thermal conductivity and insulating properties, a ratio of a volume average particle diameter of the second filler to a volume average particle diameter of the first filler (the volume average particle diameter of the second filler/the volume average particle diameter of the first filler) is preferably from 3 to 25, and from viewpoints of packability and thermal conductivity more preferably from 5 to 20. Further, from viewpoints of thermal conductivity and insulating properties, a ratio of a volume average particle diameter of the third filler to a volume average particle diameter of the second filler (the volume average particle diameter of the third filler/the volume average particle diameter of the second filler) is preferably more than 1 and not more than 12, and more preferably more than 1 and not more than 10. Further, from viewpoints of thermal conductivity and insulating properties, a ratio of a volume average particle diameter of the fourth filler to a volume average particle diameter of the third filler (the volume average particle diameter of the fourth filler/the volume average particle diameter of the third filler) is preferably from 0.8 to 4, more preferably from 1 to 4, further preferably from 1.1 to 3.5, and still more preferably from 1.5 to 3.5.

There is no particular restriction on a shape (e.g. deviation) of the particle size distribution of the first filler, the second filler, the third filler, and the fourth filler, insofar as the fillers have the above volume average particle diameters respectively.

There is no other requirement on the filler with respect to the particle size distribution of the entire filler to be measured, insofar as at least four peaks, namely a peak corresponding to the first filler having a volume average particle diameter of not less than 0.01 μm and less than 1 μm, a peak corresponding to the second filler having a volume average particle diameter of not less than 1 μm and less than 10 μm, a peak corresponding to the third filler having a volume average particle diameter of from 10 μm to 50 μm, and a peak with a volume average particle diameter of from 20 μm to 100 μm, are observed.

Such an embodiment of a filler may be constituted, for example, by mixing the first filler, the second filler, the third filler, and the fourth filler, each of which shows a single peak in the particle size distribution, or by combining appropriately fillers having two or more peaks in the particle size distribution.

There is no particular restriction on a contents of the first filler, the second filler, the third filler, and the fourth filler in the filler. With respect to the respective contents of the fillers, it is preferable from a viewpoint of effective improvement of thermal conductivity that the contents of the third filler and the fourth filler are made as high as possible, and next a content of the second filler is increased. When the relative contents (based on volume) of at least four kinds of fillers having different volume average particle diameters are regulated as above, the thermal conductivity is improved more effectively. Specifically, with respect to the volume-based contents in a total volume of the first filler, the second filler, the third filler, and the fourth filler, it is preferable that a content of the first filler is from 1% by volume to 15% by volume, a content of the second filler is from 5% by volume to 25% by volume, a content of the third filler is from 5% by volume to 40% by volume, and a content of the fourth filler is from 15% by volume to 90% by volume.

It is preferable that a content of the first filler is from 1% by volume to 15% by volume, a content of the second filler is from 5% by volume to 25% by volume, a content of the third filler is from 5% by volume to 40% by volume, and a content of the fourth filler is from 15% by volume to 85% by volume, based on a total volume of the first filler, the second filler, the third filler and the fourth filler.

With respect to the respective contents of the fillers, it is more preferable from a viewpoint of thermal conductivity coefficient that a content of the first filler is from 3% by volume to 14% by volume, a content of the second filler is from 8% by volume to 23% by volume, a content of the third filler is from 8% by volume to 37% by volume, and a content of the fourth filler is from 18% by volume to 80% by volume, based on a total volume of the first filler, the second filler, the third filler and the fourth filler.

It is further preferable from a viewpoint of filler packability with respect to the respective contents of the fillers in a total volume of the first filler, the second filler, the third filler and the fourth filler, that a content of the first filler is from 5% by volume to 13% by volume, a content of the second filler is from 10% by volume to 21% by volume, a content of the third filler is from 10% by volume to 35% by volume, and a content of the fourth filler is from 20% by volume to 85% by volume.

It is further preferable from a viewpoint of filler packability with respect to the respective contents of the fillers in a total volume of the first filler, the second filler, the third filler and the fourth filler, that a content of the first filler is from 5% by volume to 13% by volume, a content of the second filler is from 10% by volume to 21% by volume, a content of the third filler is from 10% by volume to 35% by volume, and a content of the fourth filler is from 20% by volume to 75% by volume.

With respect to the respective contents of the fillers, it is more preferable from a viewpoint of thermal conductivity coefficient that a content of the first filler is from 3% by volume to 14% by volume, a content of the second filler is from 8% by volume to 23% by volume, a content of the third filler is from 8% by volume to 37% by volume, and a content of the fourth filler is from 18% by volume to 80% by volume.

The filler may contain a filler other than the first filler, the second filler, the third filler and the fourth filler. There is no particular restriction on a total content of the first filler, the second filler, the third filler and the fourth filler in the filler. From a viewpoint of more effective improvement of thermal conductivity, a total content of the first filler, the second filler, the third filler and the fourth filler in a total volume of the fillers is preferably 65% by volume or more, more preferably 68% by volume or more, and further preferably 72% by volume or more.

From a viewpoint of thermal conductivity, a total content of the third filler and the fourth filler in a total volume of the fillers is preferably from 60% by volume to 90% by volume, more preferably from 60% by volume to 85% by volume, further preferably from 62% by volume to 85% by volume, still more preferably, from 62% by volume to 82.5% by volume, and extremely preferably 64% by volume or less and 80% by volume or less.

With respect to content ratios (based on volume) among the respective fillers, it is preferable from viewpoints of packability and thermal conductivity that a content ratio of the second filler to the first filler is from 0.4 to 25, a content ratio of the third filler to the first filler is from 1 to 60, and a content ratio of the fourth filler to the first filler is from 1 to 60; it is more preferable that a content ratio of the second filler to the first filler is from 1 to 15, a content ratio of the third filler to the first filler is from 1 to 30, and a content ratio of the fourth filler to the first filler is from 3 to 30; and it is further preferable that a content ratio of the second filler to the first filler is from 1.5 to 5, a content ratio of the third filler to the first filler is from 2 to 20, and a content ratio of the fourth filler to the first filler is from 2 to 20.

From a viewpoint of thermal conductivity, a volume ratio of the fourth filler to the third filler is preferably from 0.15 to 8.5, more preferably from 0.3 to 7.0, and further preferably from 0.5 to 6.0.

With respect to the fillers, it is preferable from viewpoints of packability and thermal conductivity that the volume average particle diameters of the first filler, the second filler, the third filler and the fourth filler are respectively not less than 0.01 μm and less than 1 μm, not less than 1 μm and less than 10 μm, from 10 μm to 50 μm, and from 20 μm to 100 μm, and the contents of the first filler, the second filler, the third filler and the fourth filler in a total volume of the fillers are respectively from 1% by volume to 15% by volume, from 5% by volume to 25% by volume, from 5% by volume to 40% by volume, and from 15% by volume to 90% by volume.

Further, it is preferable from viewpoints of packability and thermal conductivity that the volume average particle diameters of the first filler, the second filler, the third filler and the fourth filler are respectively not less than 0.01 μm and less than 1 μm, not less than 1 μm and less than 10 μm, from 10 μm to 50 μm, and from 20 μm to 100 μm, and the contents of the first filler, the second filler, the third filler and the fourth filler in a total volume of the fillers are respectively from 1% by volume to 15% by volume, from 5% by volume to 25% by volume, from 5% by volume to 40% by volume, and from 15% by volume to 85% by volume.

It is more preferable that the volume average particle diameters of the first filler, the second filler, the third filler and the fourth filler are respectively from 0.05 μm to 0.8 μm, from 1.2 μm to 8 μm, from 14 μm to 45 μm, and from 24 μm to 85 μm, and the contents of the first filler, the second filler, the third filler and the fourth filler in a total volume of the fillers are respectively from 3% by volume to 14% by volume, from 8% by volume to 23% by volume, from 8% by volume to 37% by volume, and from 18% by volume to 80% by volume.

Further, it is further preferable that the volume average particle diameters of the first filler, the second filler, the third filler, and the fourth filler are respectively from 0.1 μm to 0.6 μm, from 1.4 μm to 6 μm, from 17 μm to 35 μm, and from 36 μm to 60 μm, and the contents of the first filler, the second filler, the third filler and the fourth filler in a total volume of the fillers are respectively from 5% by volume to 13% by volume, from 10% by volume to 21% by volume, from 10% by volume to 35% by volume, and from 20% by volume to 75% by volume.

A content of a boron nitride particle contained in the fillers with respect to a total volume of the fillers as 100% by volume is from a viewpoint of thermal conductivity preferably from 30% by volume to 95% by volume, more preferably from 30% by volume to 90% by volume, further preferably from 34% by volume to 90% by volume, still more preferably from 34% by volume to 85% by volume, from a viewpoint of adhesiveness extremely preferably from 38% by volume to 85% by volume, and further extremely preferably from 38% by volume to 80% by volume.

There is no particular restriction on a content of fillers in the resin composition. A content of fillers with respect to a total volume of solids in the resin composition is from viewpoints of thermal conductivity and adhesiveness preferably from 40% by volume to 90% by volume, and more preferably from 50% by volume to 90% by volume. Further, from a viewpoint of thermal conductivity, a content of fillers with respect to a total volume of solids in the resin composition is preferably from 45% by volume to 85% by volume, and more preferably from 60% by volume to 85% by volume. In this regard, a total volume of solids in the resin composition means a total volume of non-volatile components among components constituting the resin composition.

(Novolac Resin)

The resin composition contains a novolac resin containing at least one kind of compound having a structural unit represented by the following Formula (I) (hereinafter also referred to as "first specific novolac resin"). A novolac resin acts, for example, as a curing agent and reacts with an epoxy resin monomer described below to form a cured resin to exhibit insulating properties and adhesiveness. In a case in which a novolac resin a compound having a specific structural unit, and fillers showing a specific particle size distribution and containing a boron nitride particle and an aluminum oxide particle are included, before curing insulating properties and adhesiveness, and after curing superior thermal conductivity, insulating properties, and adhesive strength can be exhibited.

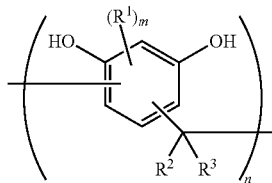

In Formula (I), $R^1$ represents an alkyl group, an aryl group, or an aralkyl group. The alkyl group, aryl group, and aralkyl group represented by R' may further have, if possible, a substituent. Examples of the substituent include an alkyl group, an aryl group, a halogen atom, and a hydroxy group.

m represents a number from 0 to 2. In a case in which m is 2, the two $R^1$s may be the same or different. From viewpoints of adhesiveness and thermal conductivity, m is preferably 0 or 1, and more preferably 0. n is a number from 1 to 7 and represents a repetition number of the structural unit represented by Formula (I). When the first specific novolac resin is a single compound, n is an integer. When the first specific novolac resin is composed of a plurality of molecular kinds, n is an average value of the numbers of structural units represented by Formula (I) included and is a rational number. When the first specific novolac resin includes a plurality of molecular kinds having a structural unit represented by Formula (I), from viewpoints of adhesiveness and thermal conductivity n is preferably an average value of from 1.7 to 6.5, and more preferably from 2.4 to 6.1.

The first specific novolac resin has only to include at least one kind of compound having a structural unit represented by Formula (I), and may include two or more kinds of compounds having a structural unit represented by Formula (I).

Since the first specific novolac resin includes a compound having a structural unit represented by Formula (I), the resin includes at least a partial structure derived from resorcinol as a phenolic compound. The first specific novolac resin may further include at least one kind of partial structure derived from a phenolic compound other than resorcinol. Examples of a phenolic compound other than resorcinol include phenol, cresol, catechol, hydroquinone, 1,2,3-trihydroxybenzene, 1,2,4-trihydroxybenzene, and 1,3,5-trihydroxybenzene. The first specific novolac resin may include a single kind of, or a combination of two or more kinds of partial structures derived from the above compounds. In this regard, a partial structure derived from a phenolic compound means a monovalent or divalent group formed by removing one or two hydrogen atoms from a moiety of a benzene ring of a phenolic compound. There is no particular restriction on a position, where a hydrogen atom is removed.

A partial structure derived from a phenolic compound other than resorcinol for the first specific novolac resin is from viewpoints of thermal conductivity, adhesiveness and storage stability preferably a partial structure derived from at least one kind selected from the group consisting of phenol, cresol, catechol, hydroquinone, 1,2,3-trihydroxybenzene, 1,2,4-trihydroxybenzene and 1,3,5-trihydroxybenzene.

There is no particular restriction on a content of a partial structure derived from resorcinol in the first specific novolac resin. From a viewpoint of thermal conductivity, a content of a partial structure derived from resorcinol with respect to the total mass of the first specific novolac resin is preferably 20% by mass or more, and from a viewpoint of higher thermal conductivity more preferably 50% by mass or more. There is no particular restriction on an upper limit of a content of a partial structure derived from resorcinol with respect to the total mass of the first specific novolac resin, and the upper limit is preferably, for example, 98% by mass or less.

In Formula (I), each of $R^2$ and $R^3$ independently represents a hydrogen atom, an alkyl group, an aryl group, or an aralkyl group. The alkyl group, aryl group, and aralkyl group represented by $R^2$ and $R^3$ may further have, if possible, a substituent. Examples of the substituent include an alkyl group, an aryl group, a halogen atom and a hydroxy group.

Each of $R^2$ and $R^3$ is independently, and from viewpoints of storage stability and thermal conductivity preferably, a hydrogen atom, an alkyl group, or an aryl group, more preferably a hydrogen atom, an alkyl group having from 1 to 4 carbon atoms, or an aryl group having from 6 to 10 carbon atoms, further preferably a hydrogen atom, or a phenyl group, and still more preferably a hydrogen atom. Further, from a viewpoint of heat resistance, it is also preferable that at least one of $R^2$ and $R^3$ is an aryl group having from 6 to 10 carbon atoms (more preferably, a phenyl group).

Specifically, the first specific novolac resin is preferably a novolac resin including at least one kind of structural units represented by the following Formula (Ia) to Formula (If).

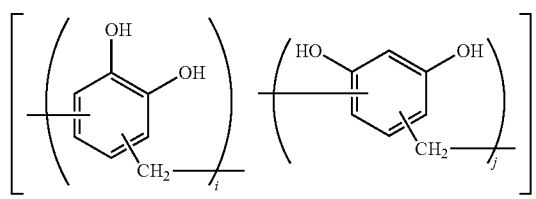

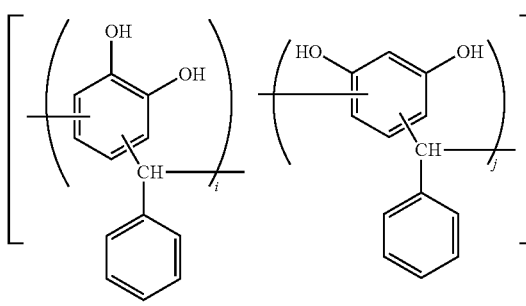

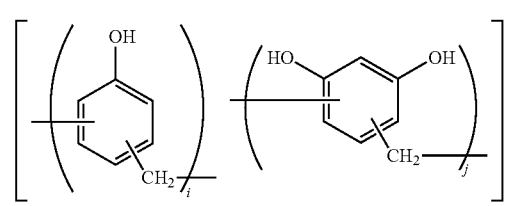

In Formula (Ia) to Formula (If), i and j represent the relative content (% by mass) of a structural unit derived from the respective phenolic compounds. i is from 2% by mass to 30% by mass, and j is from 70% by mass to 98% by mass, in which the sum of i and j is 100% by mass.

It is preferable from a viewpoint of thermal conductivity that the first specific novolac resin includes a structural unit represented by at least one selected from the group consisting of Formula (Ia) and Formula (Ie), and that i is from 2% by mass to 20% by mass, and j is 80% by mass or more and equal to 98% by mass; meanwhile it is more preferable from viewpoints of elastic modulus and linear expansion coefficient, that the first specific novolac resin includes a structural unit represented by Formula (Ia), and that i is from 5% by mass to 10% by mass, and j is from 90% by mass to 95% by mass.

The first specific novolac resin includes a compound having a structural unit represented by Formula (I), and preferably includes at least one kind of compound represented by the following Formula (III).

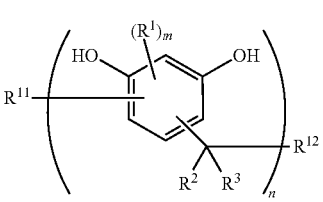

In Formula (III), $R^{11}$ represents a hydrogen atom, or a monovalent group derived from a phenolic compound represented by the following Formula (IIIp), and $R^{12}$ represents a monovalent group derived from a phenolic compound. $R^1$, $R^2$, $R^3$, m and n have respectively the same meanings as $R^1$, $R^2$, $R^3$, m and n in Formula (I). A monovalent group represented by $R^{12}$ derived from a phenolic compound is a monovalent group formed by removing a hydrogen atom from a moiety of a benzene ring of a phenolic compound. There is no particular restriction on a position, where a hydrogen atom is removed.

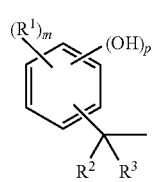

(IIIp)

In Formula (IIIp), p represents a number from 1 to 3. $R^1$, $R^2$, $R^3$ and m have respectively the same meanings as $R^1$, $R^2$, $R^3$ and m in Formula (I).

There is no particular restriction on a phenolic compound of $R^{11}$ and $R^{12}$, insofar as it is a compound having a phenolic hydroxy group. Specific examples of the phenolic compound include phenol, cresol, catechol, resorcinol and hydroquinone. Among others, from viewpoints of thermal conductivity and storage stability a phenolic compound of $R^{11}$ and $R^{12}$ is preferably at least one selected from the group consisting of cresol, catechol and resorcinol.

A number average molecular weight of the first specific novolac resin is, from viewpoints of thermal conductivity and moldability, preferably 800 or less, from viewpoints of elastic modulus and linear expansion coefficient more preferably from 300 to 750, and from viewpoints of moldability and adhesive strength further preferably from 350 to 550.

The first specific novolac resin, from a viewpoint of flexibility, preferably further contains a monomer, which is a phenolic compound for forming a novolac resin. In general, a novolac resin is synthesized through condensation polymerization of a phenolic compound and an aldehyde compound. Therefore, a phenolic compound for forming a novolac resin means a phenolic compound used for synthesis of a novolac resin. A phenolic compound included in the first specific novolac resin may be a phenolic compound remained in a synthesis of the novolac resin, or a phenolic compound added separately after a synthesis of the novolac resin.

A phenolic compound to be contained in the first specific novolac resin is selected corresponding to the structure of the first specific novolac resin. Among others, a phenolic compound is preferably at least one selected from the group consisting of resorcinol, catechol, 1,2,4-trihydroxybenzene, 1,3,5-trihydroxybenzene, and 1,2,3-trihydroxybenzene, and more preferably at least one selected from the group consisting of resorcinol and catechol.

A content of a phenolic compound in the first specific novolac resin (hereinafter also referred to as "monomer content") is from a viewpoint of thermal conductivity coefficient preferably from 5% by mass to 50% by mass in the first specific novolac resin, more preferably from 8% by mass to 45% by mass, and further preferably from 10% by mass to 40% by mass.

In this regard, a monomer content is a value measured by NMR. The conditions for a NMR measurement will be described in Examples.

There is no particular restriction on a content of the first specific novolac resin in the resin composition. A content of the first specific novolac resin is from viewpoints of thermal conductivity and adhesiveness preferably from 0.3% by mass to 10% by mass with respect to the total mass of solids in a resin composition, from a viewpoint of thermal conductivity more preferably from 0.5% by mass to 9% by mass, and further preferably from 0.7% by mass to 8% by mass. In this regard, the total mass of solids in a resin composition means the total mass of non-volatile components among components constituting the resin composition.

The resin composition contains from viewpoints of insulating properties and heat resistance preferably at least one kind of other novolac resin not including a structural unit represented by Formula (I) in addition to the first specific novolac resin. There is no particular restriction on such other novolac resin, insofar as the same is a novolac resin not including a structural unit represented by Formula (I), and any of novolac resins which are used ordinarily as a curing agent for an epoxy resin may be selected appropriately.

As such other novolac resin, a compound having a structural unit represented by the following Formula (II) (hereinafter also referred to as "second specific novolac resin") is preferable.

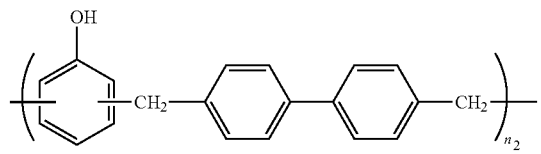

(II)

In Formula (II), $n_2$ is a number from 1 to 10 and the number of an included structural unit represented by Formula (II). When the second specific novolac resin is a single compound, $n_2$ is an integer. When the second specific novolac resin is composed of a plurality of molecular kinds, $n_2$ is an average value of the numbers of structural units represented by Formula (II) included and is a rational number. When the second specific novolac resin includes a plurality of molecular kinds having a structural unit represented by Formula (II), from viewpoints of adhesiveness and thermal conductivity $n_2$ is preferably an average value of from 1.5 to 9.5, and more preferably from 2.0 to 9.0.

When a novolac resin includes a second specific novolac resin containing a compound having a structural unit represented by Formula (II), the moisture absorption resistance and the adhesive strength tend to be improved in a B-stage. Conceivably this is because entry of moisture among molecules is prevented due to presence of a biphenyl group constituting a crystalline structure in the second specific novolac resin. Since, in the case of a second novolac resin, a molecular weight between cross linking points becomes large, expansion and contraction of a molecular chain can easily occur when an external force is applied. Owing to this, a resin composition adhered to, for example, a metal plate can conceivably exhibit a higher adhesive strength.

It is so understood that, when a second specific novolac resin is included, a hydroxy group of the second specific novolac resin forms a coordinate bond with a metal atom on a metal plate surface, such as copper and aluminum, in a C stage of a resin composition, so as to exhibit a superior interfacial adhesive strength. Further, since the molecule weight between cross linking points in the second specific novolac resin is large, it is understood that the resin strength is improved owing to easier elongation by an external force. Consequently, it is conceived that by inclusion of the second specific novolac resin, the resin in a C stage exhibits advantages of low elastic modulus and high strength and can form a cured product in which humidity hardly penetrates. Since a surface of an aluminum oxide particle is a metallic oxide and tends basicity, it is conceived that the surface forms easily a coordinate bond with a hydroxy group of the second specific novolac resin so that the resin component adheres more favorably to the filler surface. As the result, presumably, a phonon, which is a medium of thermal conduction, does not easily scatter so that thermal resistance decreases, and moisture does not easily penetrate into an interface between a resin component and a filler.

A number average molecular weight of the second specific novolac resin is from viewpoints of thermal conductivity and moldability preferably from 300 to 800, from viewpoints of elastic modulus and linear expansion coefficient more preferably from 350 to 700, and from viewpoints of moldability and adhesive strength further preferably from 400 to 600.

In a case in which a resin composition further contains another novolac resin (preferably, a second specific novolac resin), there is no particular restriction on a content of such other novolac resin. A content of such other novolac resin is from viewpoints of thermal conductivity and adhesiveness preferably from 0.3% by mass to 8% by mass, more preferably from 0.5% by mass to 7% by mass, and further preferably from 0.7% by mass to 6% by mass with respect to total mass of solids in the resin composition.

Further, in a case in which a resin composition further contains another novolac resin (preferably, a second specific novolac resin), a content of such other novolac resin is preferably from 5% by mass to 95% by mass, more preferably from 10% by mass to 85% by mass, and further preferably from 15% by mass to 75% by mass, with respect to the first specific novolac resin.

The resin composition may further contain in addition to a novolac resin at least one kind of other curing agent. There is no particular restriction on other curing agent, insofar as it is a compound able to react with an epoxy resin monomer to form a resin cured product. Specific examples of such other curing agent include an aromatic amine curing agent, an aliphatic amine curing agent, a mercaptan curing agent, and a polyaddition curing agent such as an acid anhydride curing agent. In addition to such other curing agents, a curing catalyst, such as imidazole, triphenylphosphine, and derivatives obtained by introducing a side chain in the compounds, may be contained.

In a case in which a resin composition further contains another curing agent, there is no particular restriction on a content of such other curing agent. The content is from a viewpoint of thermal conductivity preferably 30% by mass or less, more preferably 20% by mass or less, and further preferably 10% by mass or less with respect to the first specific novolac resin.

There is no particular restriction on a total content of the first specific novolac resin, as well as another novolac resin and another curing agent, which may be contained as needed, (hereinafter also collective referred to simply as "curing agent") in a resin composition. A total content of curing agents with respect to the total mass of solids in a resin composition is from viewpoints of thermal conductivity and adhesiveness preferably from 1% by mass to 10% by mass, more preferably from 1.2% by mass to 8% by mass, and further preferably from 1.4% by mass to 7% by mass. Meanwhile, a content of a curing agent in a resin composition on an equivalent basis with respect to an epoxy resin monomer described below is preferably from 0.8 to 1.2, and more preferably from 0.9 to 1.1. In this regard, equivalent means a reaction equivalent, and, for example, an equivalent of a novolac resin is calculated assuming that one phenolic hydroxy group reacts with one epoxy group, an equivalent of an amine is calculated assuming that one active hydrogen of an amino group reacts with one epoxy group, and an equivalent of an anhydrous acid of an acid anhydride is calculated assuming that one acid anhydride group reacts with one epoxy group.

(Epoxy Resin Monomer)

The resin composition contains at least one kind epoxy resin monomer (hereinafter occasionally referred to simply as "epoxy resin"). As the epoxy resin a general epoxy resin used ordinarily may be used without particular restriction. Among others, those having a low viscosity, being superior in filler packability and moldability before curing, and having high heat resistance and adhesiveness as well as high thermal conductivity after thermal curing are preferable.

When an epoxy resin monomer forms a cured resin together with a novolac resin having the specific structural unit, a higher order structure having high regularity derived from a covalent bond or an intermolecular force can be formed in the cured resin. As the result, presumably, a phonon which is a medium for thermal conduction in a cured resin is suppressed from scattering, and higher thermal conductivity can be achieved.

Specific examples of a general epoxy resin include a glycidyl ether of bisphenol A, F, S, and AD, such as a bisphenol A epoxy resin, a bisphenol F epoxy resin, a bisphenol S epoxy resin, and a bisphenol AD epoxy resin; a hydrogenated bisphenol A epoxy resin, a hydrogenated bisphenol AD epoxy resin; glycidyl ether of phenol novolac (phenol novolac epoxy resin), glycidyl ether of cresol novolac (cresol novolac epoxy resin), glycidyl ether of bisphenol A novolac, glycidyl ether of naphthalene (naphthalene epoxy resin), glycidyl ether of biphenol (biphenol epoxy resin), glycidyl ether of dihydroxypentadiene (dihydroxypentadiene epoxy resin); and a triphenylmethane epoxy resin.

As an epoxy resin monomer, those with low viscosity, and superior filler packability and moldability before curing, and with high heat resistance and adhesiveness as well as high thermal conductivity after thermal curing are preferable. For example, an epoxy resin monomer is preferably in a liquid form at 25° C. (hereinafter occasionally referred to as "liquid epoxy resin"). In this case, flexibility in sheeting, or flowability in layered can be easily exerted. Further, by using a liquid epoxy resin, the softening point of a resin in an A-stage and a B stage of a resin sheet can be lowered. Specifically, by using a liquid epoxy resin, the flexibility of a sheet is improved and the handling property can be superior, and the melt viscosity during bonding can be lowered. With a liquid epoxy resin, the Tg (glass transition temperature) and the thermal conductivity after curing may be low, and a content of a liquid epoxy resin may be selected appropriately considering a balance with physical properties of a cured resin.

Examples of an epoxy resin monomer, which is in a liquid form at 25° C., include a bisphenol A epoxy resin, a bisphenol F epoxy resin, a bisphenol AD epoxy resin, a hydrogenated bisphenol A epoxy resin, a hydrogenated bisphenol AD epoxy resin, a naphthalene epoxy resin, and an epoxy resin, which is also called as a reactive diluent and has only one epoxy group. As an epoxy resin monomer, which is in a liquid form at 25° C., from viewpoints of an elastic modulus change with temperature and thermophysical properties after curing, at least one kind selected from the group consisting of a bisphenol A epoxy resin, a bisphenol F epoxy resin, a bisphenol AD epoxy resin, and a naphthalene epoxy resin, is preferable.

There is no particular restriction on a molecular weight of the epoxy resin monomer, which is in a liquid form at 25° C., and the molecular weight is, for example from a viewpoint of flowability in layered preferably from 100 to 100,000, more preferably from 200 to 50,000, and further preferably from 300 to 10,000.

In this regard, the molecular weight is a value measured by gel permeation chromatography (GPC). The measurement conditions of GPC will be described in Examples below.

In particular, when at least one kind of a liquid epoxy resin having a molecular weight of 500 or less selected from the group consisting of a bisphenol A epoxy resin, and a bisphenol F epoxy resin is included, flexibility in sheeting or flowability in layered can be improved further.

An epoxy resin monomer may contain a multifunctional epoxy resin. By this means, higher Tg and higher thermal conductivity can be effectively achieved. Favorable examples of a multifunctional epoxy resin include a phenol novolac epoxy resin, a cresol novolac epoxy resin and a triphenylmethane epoxy resin.

Further, an epoxy resin monomer may contain from a viewpoint of thermal conductivity an epoxy resin monomer having a mesogenic group.

The mesogenic group mentioned above means those able to form a higher order structure derived from a mesogenic group in a cured resin, when an epoxy resin monomer is reacted with a curing agent to form a cured resin. The higher order structure referred to above means a state in which molecules are aligned after curing of a resin composition, for example, a state in which a crystal structure or a liquid crystal structure is present in a cured resin. Existence of such a crystal structure or a liquid crystal structure can be directly confirmed, for example, by observation under a polarization microscope with crossed nicols, or by an X-ray scattering spectrum. Alternatively, based on decrease in a storaging elastic modulus change according to a temperature change, existence of a crystal structure or a liquid crystal structure can be indirectly confirmed.

Specific examples of a mesogenic group include a biphenyl group, a terphenyl group, a terphenyl analog, and an anthracene group, a group formed by linking those groups with an azomethine group, an ester group or the like.

By forming a cured resin through a reaction of an epoxy resin monomer with a curing agent using an epoxy resin monomer having a mesogenic group as the former, higher thermal conductivity can be achieved. The possible reason for this is as follows. Namely, by forming a cured resin using an epoxy resin monomer having a mesogenic group in a molecule and the first specific novolac resin, a higher order structure with high regularity derived from a mesogenic group can be formed in a cured resin. As the result, presumably, a phonon which is a medium for thermal conduction in a cured resin is suppressed from scattering, and higher thermal conductivity can be achieved.

Specific examples of an epoxy resin monomer having a mesogenic group include 4,4'-biphenol glycidyl ether, 3,3', 5,5'-tetramethyl-4,4'-biphenol glycidyl ether, 1-[(3-methyl-4-oxiranylmethoxy)phenyl]-4-(4-oxiranylmethoxyphenyl)-1-cyclohexene, 4-(oxiranylmethoxy)benzoic acid-1,8-octanediylbis(oxy-1,4-phenylene)ester, 2,6-bis[4-[4-[2-(oxiranylmethoxy)ethoxy]phenyl]phenoxy]pyridine.

Among them, from a viewpoint of improving thermal conductivity, 4,4'-biphenol glycidyl ether, or 3,3',5,5'-tetramethyl-4,4'-biphenol glycidyl ether is preferable.

There is no particular restriction on a content of an epoxy resin monomer in a resin composition. A content of an epoxy resin monomer with respect to the total mass of solids constituting a resin composition is from viewpoints of thermal conductivity and adhesiveness preferably from 3% by mass to 30% by mass, from a viewpoint of thermal conductivity more preferably from 5% by mass to 25% by mass, and further preferably from 5% by mass to 20% by mass.

A resin composition contains as an epoxy resin monomer an epoxy resin monomer having a mesogenic group from viewpoints of thermal conductivity and high elastic modulus preferably from 3% by mass to 30% by mass with respect to the total mass of solids in a resin composition, and more preferably at least one kind of epoxy resin monomer having a mesogenic group selected from the group consisting of 4,4'-biphenol glycidyl ether, 3,3',5,5'-tetramethyl-4,4'-biphenol glycidyl ether, 1-[(3-methyl-4-oxiranylmethoxy)phenyl]-4-(4-oxiranylmethoxyphenyl)-1-cyclohexene, 4-(oxiranylmethoxy)benzoic acid-1,8-octanediylbis(oxy-1,4-phenylene)ester, and 2,6-bis[4-[4-[2-(oxiranylmethoxy)ethoxy]phenyl]phenoxy]pyridine at from 5% by mass to 25% by mass with respect to the total mass of solids in a resin composition.

The resin composition contains as an epoxy resin monomer from viewpoints of thermal conductivity and heat resistance preferably at least one kind selected from the group consisting of a phenol novolac epoxy resin, a cresol novolac epoxy resin, a triphenylmethane epoxy resin and a biphenyl epoxy resin, and at least one kind selected from the group consisting of a bisphenol A epoxy resin, a bisphenol F epoxy resin, a bisphenol AD epoxy resin and a naphthalene epoxy resin at a mass ratio of from 15:85 to 85:15, and at from 3% by mass to 30% by mass with respect to a total mass of solids in a resin composition; and more preferably at least one kind selected from the group consisting of triphenylmethane epoxy resins, and at least one kind selected from the group consisting of a bisphenol A epoxy resin and a bisphenol F epoxy resin at a mass ratio of from 30:70 to 70:30, and at from 5% by mass to 25% by mass with respect to a total mass of solids in a resin composition.

(Silane Coupling Agent)

The resin composition may further contain at least one kind of silane coupling agent. When the resin composition contains a silane coupling agent, the affinity between a filler and a resin component including an epoxy resin monomer and a novolac resin is improved, and higher thermal conductivity and higher adhesiveness can be achieved, There is no particular restriction on a silane coupling agent, insofar as it is a compound having a functional group able to bond to a resin component and a functional group able to bond to a filler, and an appropriate one may be selected from ordinarily used silane coupling agents. Examples of the functional group able to bond to a filler include a trialkoxysilyl group, such as a trimethoxysilyl group and a triethoxysilyl group. Examples of the functional group able to bond to a resin component include an epoxy group, an amino group, a mercapto group, an ureido group and an aminophenyl group.

Specific examples of a silane coupling agent include 3-glycidoxypropyltrimethoxysilane, 3-glycidoxypropyltriethoxysilane, 3-glycidoxypropylmethyldimethoxysilane, 2-(3,4-epoxycyclohexyl)ethyltrimethoxysilane, 3-aminopropyltriethoxysilane, 3-(2-aminoethyl)aminopropyltriethoxysilane, 3-aminopropyltrimethoxysilane, 3-(2-aminoethyl)aminopropyltrimethoxysilane, 3-phenylaminopropyltrimethoxysilane, 3-mercaptotriethoxysilane, and 3-ureidopropyltriethoxysilane. Further, a silane coupling agent oligomer such as SC-6000KS2 (produced by Hitachi Chemical Techno Service Co., Ltd.) may be also used. The silane coupling agents may be used singly, or in a combination of two or more kinds.

When a resin composition contains a silane coupling agent, there is no particular restriction regarding a content of a silane coupling agent in a resin composition. A content of a silane coupling agent with respect to the total mass of solids in a resin composition is from a viewpoint of thermal conductivity preferably from 0.02% by mass to 0.83% by mass, and more preferably from 0.04% by mass to 0.42% by mass.

When a resin composition contains a silane coupling agent, a content of a silane coupling agent with respect to a content of a filler is from viewpoints of thermal conductivity, insulating properties and moldability preferably from 0.02% by mass to 1% by mass, and from a viewpoint of higher thermal conductivity more preferably from 0.05% by mass to 0.8% by mass.

(Other Components)

The resin composition may contain, if necessary, other components in addition to the above components. Examples of such other components include an organic solvent, a curing promoter and a dispersing agent.

(Method for Producing Resin Composition)

As a method for producing a resin composition, an ordinary method for producing a resin composition may be used without particular restriction. As a method for mixing an epoxy resin monomer, a novolac resin, a filler and the like, ordinary dispersers, such as a stirrer, a grinding machine, a triple roll mill and a ball mill, may be used in an appropriate combination. Further, dispersion or dissolution with addition of an appropriate organic solvent may be performed.

Specifically, a resin composition can be prepared by, for example, dissolving or dispersing an epoxy resin, a novolac resin, a filler and a silane coupling agent to be added as need in an appropriate organic solvent, and if necessary mixing therewith other components, such as a curing promoter.

An organic solvent desirably has a low boiling point or a high vapor pressure, since the organic solvent is removed at least partly by a drying treatment in a drying process of a method for producing a resin sheet described below. In a case in which a large amount of the organic solvent is remained in a resin sheet, thermal conductivity or insulating properties may be affected. On the contrary, there are cases in which the organic solvent is removed completely so that a sheet may be too stiff and the adhesiveness may be lost. Therefore, for selection of an organic solvent, conformity with a drying method and a drying condition is necessary. An organic solvent may be selected appropriately according to a type of a resin, a type of a filler to be used, easiness of drying in sheeting or the like. Examples of an organic solvent include an alcohol solvent, such as methanol, ethanol, 1-propanol, 2-propanol, 1-butanol, 2-butanol and cyclohexanol; a ketone solvent, such as methyl ethyl ketone, cyclohexanone and cyclopentanone; and a nitrogen-containing solvent, such as dimethylformamide and dimethylacetamide. The organic solvents may be used singly, or in a combination of two or more kinds.

<Resin Sheet>

A resin sheet in the present invention is a sheet-shaped product formed from the resin composition, whose an average thickness is from 40 μm to 250 μm. Since the resin sheet is formed from the resin composition, it is superior in storage stability before curing and thermal conductivity after curing. Details of a resin composition are as described above. A resin sheet is superior in insulating properties at high temperature and high humidity.

The average thickness of a resin sheet is from 40 μm to 250 μm, from a viewpoint of achievement of both thermal conductivity and insulating properties preferably from 50 μm to 240 μm, more preferably from 60 μm to 230 μm, and further preferably from 70 μm to 220 μm. The average thickness of a resin sheet may be selected appropriately considering a balance among electrical properties, such as a voltage to be insulated and a current value, and thermal resistance value between a heat generater and a sheet. Insofar as a required thermal resistance value is satisfied, from a viewpoint of insulating properties, the average thickness of a resin sheet is preferably as thick as possible. In this regard, the average thickness of a resin sheet is determined by measuring a thickness at 9 points using a micrometer (for example, micrometer IP65, produced by Mitutoyo Corporation) and taking an arithmetic mean value thereof.

A resin sheet preferably has further a support at least on one face thereof, and more preferably has supports on both faces thereof. By this means, a foreign substance from the external environment is prevented from sticking to an adhesive surface of a resin sheet, and a resin sheet is protected from an impact. In other words, a support functions as a protective film. When used, a support is preferably peeled off appropriately.

Examples of a support include plastic films, such as a polytetrafluoroethylene film, a polyethylene terephthalate film, a polyethylene film, a polypropylene film, a polymethylpentene film and a polyimide film. The plastic films may be, if necessary, subjected to a surface treatment, such as primer coating, a UV treatment, a corona discharge treatment, a polishing treatment, an etching treatment and a mold-releasing treatment. Further as a support, a metallic foil, such as a copper foil and an aluminum foil, and a metal plate such as an aluminum plate, may be used.

When a support is a plastic film, there is no particular restriction on an average thickness thereof. The average thickness may be decided according to the average thickness of a resin sheet to be formed and application of a resin sheet, using knowledge of a person skilled in the art. The average thickness of a plastic film is preferably from 10 μm to 150 μm, since it is economical and a handling property is favorable, and more preferably from 25 μm to 110 μm.

In a case in which a support is a metallic foil, there is no particular restriction on an average thickness thereof, and it may be selected appropriately depending on application of a resin sheet or the like. For example, the average thickness of a metallic foil may be from 10 μm to 400 μm, and from a viewpoint of a handling property of a roll foil preferably from 18 μm to 300 μm.

A resin sheet is preferably a layered product constituted with a first resin layer formed from the resin composition and a second resin layer formed from the resin composition. In a case in which a resin sheet is configured as above, the insulation breakdown voltage can be improved. The resin compositions for forming the first resin layer and the second resin layer may be the same composition, or compositions different from each other. From a viewpoint of thermal conductivity, the resin composition for forming the first resin layer and the second resin layer are preferably the same composition.

A resin sheet preferably has further a metallic foil on or above one face of the layered product, and a protective film such as a polyethylene terephthalate film on or above another face thereof. In other words, it is preferable that a resin sheet has further a metallic foil and a protective film, and is configured with a metallic foil, a first resin layer, a second resin layer and a protective film, layered in this order. By this configuration, an effect of filling a void can be attained and the insulation breakdown voltage tends to be improved further.

(Method for Producing Resin Sheet)

There is no particular restriction on a method for producing a resin sheet, insofar as a sheet-formed resin layer with an average thickness of from 40 μm to 250 μm can be formed using the resin composition, and an appropriate method may be selected from ordinary methods for producing a resin sheet. Specific examples of a method for producing a resin sheet include a method by which a resin composition containing an organic solvent is applied on to a support to a desired average thickness to form a resin composition layer, and the formed resin composition layer is subjected to a drying treatment to remove at least a part of the organic solvent and to form a resin layer.

There is no particular restriction on an application method for a resin composition and a drying method, and a method may be selected appropriately out of methods ordinarily used. Examples of an application method include a comma coating method, a die coating method and a dip coating process. Examples of a drying method include drying by heating at normal pressure or reduced pressure, natural drying, and freeze-drying.

The thickness of a resin composition layer may be selected appropriately such that a resin layer after a drying treatment should have a desired average thickness. The average thickness of a resin layer after drying is from 40 μm to 250 μm, and it is preferable that the thickness of a resin composition layer is adjusted at from 50 μm to 250 μm. When the average thickness of a resin layer after drying is 40 μm or more, a void is hardly formed in a resin layer and the production likelihood tends to become large. When the average thickness of a resin layer after drying is 250 μm or less, dusting of a resin powder tends to be suppressed even when a resin roll is formed.

A resin sheet is preferably produced by layering the first resin layer and the second resin layer formed from the resin composition. With such a constitution the insulation breakdown voltage can be improved.

This can be explained as follows. Namely, by laying two resin layers one on top of the other, a thin spot (pinhole or void), which may possibly exist in one of the resin layers, can be compensated by the other resin layer. As the result, the minimum insulation thickness can be increased, so that the insulation breakdown voltage is conceivably improved. Although a probability of generating a pinhole or a void in the method for producing a resin sheet is not high, layering two resin layers leads a number of pinhole or void to become close to zero, since a probability of a coincidence of thin spots each other is square of the probability of generating. Since dielectric breakdown occurs at a spot, where the insulation is weakest, an improving result on insulation breakdown voltage can be conceivably obtained by layering two resin layers. Further, layering two resin layers also leads a contact probability between fillers to be increased, whereby an improving result on thermal conductivity can be conceivably also obtained.

The method for producing a resin sheet preferably includes: a process for producing a layered product by laying the second resin layer formed from the resin composition on the first resin layer formed from the resin composition; and a process for performing a hot press treatment on the produced layered product. By the method for producing, the insulation breakdown voltage can be improved.

It is preferable that a resin sheet has further a metallic foil on or above one face of the layered product and further a protective film on or above another face thereof. A method for producing a resin sheet with such a constitution preferably has a process in which the first resin layer formed from the resin composition on or above a metallic foil is provided on the second resin layer formed from the resin composition on or above a protective film such as a polyethylene terephthalate film, in which the resin layers contact each other. By this means, an effect of filling a void can be attained further effectively.

The first resin layer can be formed for example by applying a resin composition containing an organic solvent on a metallic foil to form a resin composition layer, and performing a drying treatment on the formed resin composition layer to remove at least a part of the organic solvent. The second resin layer can be formed for example by applying a resin composition containing an organic solvent on a protective film such as a polyethylene terephthalate film, and performing a drying treatment on the formed resin composition layer to remove at least a part of the organic solvent.

The average thicknesses of the first resin layer and the second resin layer may be selected appropriately such that, when a layered product is constituted, the average thickness of the layered product becomes from 40 μm to 250 μm. The average thicknesses of the first resin layer and the second resin layer may be, for example, respectively from 30 μm to 240 μm, and preferably from 40 μm to 230 μm. When the average thicknesses are 40 μm or more, a void is hardly formed in a resin layer and the production likelihood tends to become large. When the average thicknesses are 250 μm or less, a sheet tends to be hardly cracked. The average thicknesses of the first resin layer and the second resin layer may be the same or different each other.

Further, the layered product layering the first resin layer and the second resin layer is preferably subjected to a hot press treatment. By this means, a resin sheet having an improved thermal conductivity can be produced. There is no particular restriction on a method for a hot press treatment, insofar as it is a method able to apply a predetermined pressure and heat, and an appropriate method may be selected from ordinarily used hot press treatment methods. Specific examples include a lamination treatment, a press treatment, and a metal roll treatment. With respect to a hot press treatment, there are a technique to be treated under normal pressure, and a vacuum treatment under reduced pressure. A vacuum treatment is preferable but not limited thereto.

When a resin layer is formed with the resin composition, concavity and convexity may appear on a surface of a layered product before a hot press treatment due to fillers or the like, whereby the surface may not be smooth. A thickness of a resin sheet produced by a hot press treatment of the layered product may not be not identical with the sum of the thicknesses of resin layers, and may be smaller. This is conceivably attributable to, for example, change in filler packability before and after a hot press treatment, engagement of concavity and convexity each other at the surface, improvement of a sheet uniformness, voids filling, or the like.

A resin sheet is preferably constituted with a resin layer to be produced by removing at least a part of an organic solvent from the resin composition layer. Further, a resin sheet, in which a resin composition constituting a resin layer is made in a semi-cured state (B-stage) by performing further a hot press treatment on a resin layer produced by removing at least a part of an organic solvent, is more preferable. A resin sheet produced by drying a resin composition layer formed from a resin composition is herein occasionally referred to as an A-stage sheet, and a resin sheet produced by performing further a hot press treatment on the A-stage sheet is occasionally referred to as a B-stage sheet. The terms A-stage, B-stage, and C-stage described below are referred to the provisions according to HS K 6900:1994.

In a B-stage sheet, a resin composition is preferably in a semi-cured state. In this regard, a B-stage sheet means that a viscosity of a resin sheet is at normal temperature (25° C.) from $10^4$ Pa·s to $10^7$ Pa·s, and at 100° C. the viscosity decreases to between $10^2$ Pa·s and $10^6$ Pa·s by a range of from 0.01% to 30%. Further, a cured resin sheet after curing as described below is not melted by heating. A viscosity can be measured by a dynamic viscoelastic measurement (frequency 1 Hz, load 40 g, and rate of temperature increase 3° C./min).

When a resin sheet is a B-stage sheet, the handling property is improved. This is because curing has advanced to enhance an elastic modulus and to improve a strength compared to an A-stage sheet. Meanwhile, it is preferable for a resin sheet to limit the degree of curing to a state where a resin can be handled flexibly. Examples of a method for producing a resin layer to a semi-cured state to obtain a B-stage sheet include a hot press treatment method.

There is no particular restriction on a method for preforming a hot press treatment on a resin layer, insofar as a resin layer can be made to a semi-cured state. For example, a resin layer may be treated by a hot press treatment using a heat press or a laminator. Hot press conditions for producing a resin layer to a semi-cured state may be selected appropriately according to a constitution of a resin composition, and examples thereof include a heating temperature of from 80° C. to 200° C., and a pressure of from 0.1 M Pa to 100 M Pa for from 0.3 min to 30 min.

<Cured Resin Sheet>

A cured resin sheet in the present invention is a heat-treated product of the resin sheet. Namely, a cured resin sheet is formed by heat-treating the resin sheet so as to cure a resin composition constituting the resin sheet. Therefore, a cured resin sheet contains a cured resin derived from an epoxy resin monomer and a novolac resin containing a compound having a structural unit represented by Formula (I), and a filler, in which the filler has at least 4 peaks in a particle size distribution measured by laser diffractometry, in which four of the peaks are present respectively in ranges of not less than 0.01 μm and less than 1 μm, not less than 1 μm and less than 10 μm, from 10 μm to 50 μm, and from 20 μm to 100 μm, and in which a peak present in a range of from 10 μm to 50 μm includes an aluminum oxide particle, and a peak present in a range of from 20 μm to 100 μm includes a boron nitride particle.

Further, a cured resin sheet contains preferably a cured resin derived from an epoxy resin monomer and a novolac resin containing a compound having a structural unit represented by Formula (I); and a first filler having a volume average particle diameter of not less than 0.01 μm and less than 1 μm; a second filler having a volume average particle diameter of not less than 1 μm and less than 10 μm; a third filler having a volume average particle diameter of from 10 μm to 50 μm, and containing an aluminum oxide particle; and a fourth filler having a volume average particle diameter of from 20 μm to 100 μm, and containing a boron nitride particle.

In a cured resin sheet, there are contacts between the first filler and the fourth filler, the second filler and the fourth filler, the third filler and the fourth filler, the fourth fillers each other, and therefore, high thermal conductivity is exhibited. Since there is a large difference in terms of thermal conductivity between a resin and a filler, it is preferable in a mixture of a resin and a filler that fillers having higher thermal conductivity should be packed as close as possible to each other, thereby making the distance among fillers shortest. For example, when fillers having a high thermal conductivity coefficient contact directly each other without intercalating a resin, a heat conduction path is formed to establish a route to conduct heat, and therefore, high thermal conductivity tends to be attained.

Heat treatment conditions in producing a cured resin sheet may be selected appropriately according to a constitution of a resin composition. For example, a resin sheet may be heat-treated at from 120° C. to 250° C., for from 1 min to 300 min From a viewpoint of thermal conductivity, heat treatment conditions preferably include a temperature to easily form a higher order structure or a three-dimensional cross-linked structure. For example, with respect to a resin sheet, at least two-stage heating at from 100° C. to 160° C. and from 160° C. to 250° C. is performed more preferably, and further preferably a two or more multi-stage heat treatment is performed within the above temperature ranges.

<Resin Sheet Structure>

A resin sheet structure in the present invention contains the resin sheet and a metal plate or a radiator plate placed on or above at least one face of the resin sheet. Details of a resin sheet constituting a resin sheet structure are as described above. Examples of a metal plate or a radiator plate include a copper plate, an aluminum plate and a ceramic plate. There is no particular restriction on a thickness of a metal plate or a radiator plate, and the thickness may be selected appropriately according to an object and the like. Further, as a metal plate or a radiator plate, a metallic foil such as a copper foil and an aluminum foil may be used.

In a resin sheet structure, a metal plate or a radiator plate is placed on or above at least one face of the resin sheet, and the plates are preferably placed on both the faces.

A resin sheet structure can be produced by a production method including a process for producing a structure by placing a metal plate or a radiator plate on or above at least one face of the resin sheet.

As a method for placing a metal plate or a radiator plate on a resin sheet, an ordinarily used method may be used without any particular restriction. For example, there is a method by which a metal plate or a radiator plate is adhered on to at least one surface of a resin sheet. As an adhesion method, either of a method of adhesion using a resin component contained in a resin sheet, or a method of adhesion with grease coated on a resin sheet surface, may be applied. A proper method may be selected appropriately according to required physical properties, or a form of a semiconductor device to be constituted using a resin sheet structure. Specific examples of a layering method include a press method and a lamination method. Conditions for a press method and a lamination method may be selected appropriately according to a constitution of a resin sheet.

Further, a resin sheet structure may have a metal plate or a radiator plate on a face of the resin sheet, and an adherend on the other face. Through curing a resin sheet included in the resin sheet structure by a heat treatment of a resin sheet structure, a cured resin sheet structure can be formed, the cured resin sheet structure which is excellent in thermal conductivity between an adherend and a metal plate or a radiator plate.

There is no particular restriction on an adherend. Examples of a material for an adherend include a metal, a resin, a ceramic, and a composite material, which is a mixture of the above.

<Cured Resin Sheet Structure and Production Method Therefor>

A cured resin sheet structure in the present invention is a heat-treated product of the resin sheet structure. A method for producing a cured resin sheet structure may include: producing a resin sheet structure by placing a metal plate or a radiator plate on or above at least one face of the resin sheet; and curing the resin sheet by heating the resin sheet structure. An additional process may be included, if necessary.

As a method for placing a metal plate or a radiator plate on a resin sheet, any method ordinarily used may be used without any particular restriction. As a method for placing a metal plate or a radiator plate, there is a method, by which a metal plate or a radiator plate is adhered to at least one surface of a resin sheet. Examples of a method for adhesion include a press method and a lamination method. Conditions for a press method and a lamination method may be selected appropriately according to a constitution of a resin sheet.

It is also preferable that a method for producing a cured resin sheet structure includes hot-pressing a resin sheet structure so that a fourth filler is deformed or conformed to a metal plate or a radiator plate, after producing the resin sheet structure. There is no particular restriction on a hot-pressing method in pressing, and examples thereof include hot-pressing methods using a press, a laminator, a metal roller press or a vacuum press.

Hot-pressing conditions may be, for example, a temperature of from 80° C. to 200° C., a pressure of from 1 MPa to 100 MPa for from 0.1 min to 360 min, and preferably a temperature of from 100° C. to 190° C., a pressure of from 2 MPa to 80 MPa for from 0.5 min to 240 min. Although a hot press treatment may be carried out at atmospheric pressure (at normal pressure), it should preferably be carried out under reduced pressure. The reduced pressure condition is preferably 30,000 Pa or less, and more preferably 10,000 Pa or less.

In a method for producing a cured resin sheet structure, a resin sheet is cured by a heat treatment after producing a resin sheet structure. By a heat treatment of a resin sheet structure, thermal conductivity is improved. A heat treatment of a resin sheet structure may be carried out, for example, at from 120° C. to 250° C., for from 10 min to 300 min. Further, from a viewpoint of thermal conductivity, a heat treatment condition for a resin sheet structure should preferably include a temperature to easily form a higher order structure of a cured product. For example, in a heat treatment of a resin sheet structure, preferably at least two stage heating is performed at from 100° C. to 160° C. and from 160° C. to 250° C., and more preferably two or more multi-stage heating is performed within the above temperature ranges.

<Semiconductor Device>

A semiconductor device in the present invention includes: a semiconductor element; and the cured resin sheet placed on the semiconductor element. A semiconductor device may contain, if necessary, further another component. As a semiconductor element, semiconductor elements ordinarily used may be used without any particular restriction. Specific examples of a semiconductor element include a power semiconductor element such as an IGBT and a thyristor, and an LED element. Embodiments of a semiconductor device will be described below referring to drawings.

In FIG. 4 to FIG. 9, embodiments of a power semiconductor device to be constituted with a cured resin sheet are shown. In each figure, a description with respect to the same references may be occasionally omitted.

Figure 4:
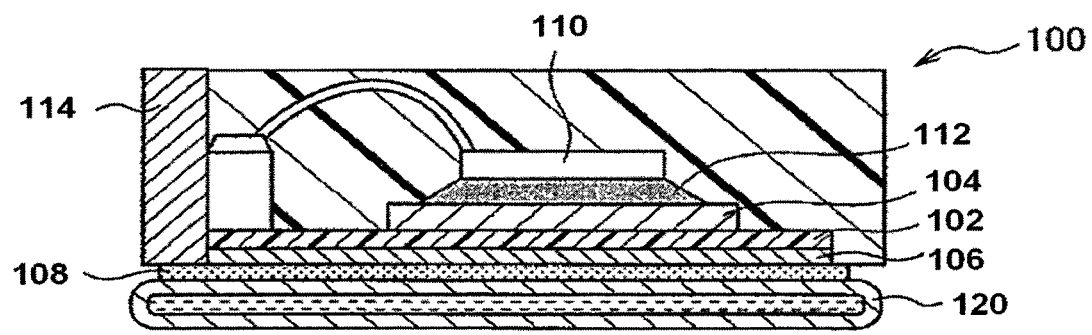
FIG. 4 is a schematic cross-sectional view showing an example of the constitution of a power semiconductor device constituted with a cured resin sheet in the present invention.

FIG. 4 is a schematic sectional view showing an embodiment of a power semiconductor device 100 in which a power semiconductor element 110 is constituted with a copper plate 104 to be placed through the intermediary of a solder layer 112, a cured resin sheet 102 in the present invention, and a heat dissipation base 106, which is placed on a water-cooling jacket 120 through the intermediary of a grease layer 108. Since a heat generator including a power semiconductor element 110 is in contact with a heat dissipation component through the intermediary of a cured resin sheet 102, heat dissipation can be carried out efficiently. In this regard, a heat dissipation base 106 can be constituted with copper, aluminum or the like, which have high thermal conductivity. Examples of a power semiconductor element include an IGBT and a thyristor. The power semiconductor element 110 is connected with an external terminal through a wiring component 114.

Figure 5:
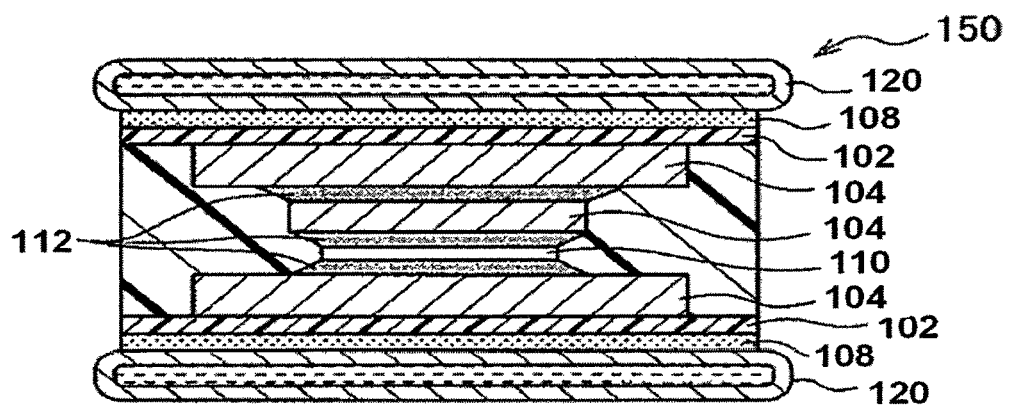
FIG. 5 is a schematic cross-sectional view showing an example of the constitution of a power semiconductor device constituted with a cured resin sheet in the present invention.

FIG. 5 is a schematic sectional view showing an embodiment of a power semiconductor device 150 constituted with cooling components placed on both faces of a power semiconductor element 110. In the power semiconductor device 150, a cooling component placed on an upper surface of the power semiconductor element 110 is constituted with two layers of copper plates 104 placed through the intermediary of a solder layer 112. Owing to such a constitution, occurrence of chip cracking and solder cracking can be suppressed effectively. In FIG. 5 a copper plate 104 placed on a remote side of the power semiconductor element 110 is connected with a water-cooling jacket 120 through the intermediary of a cured resin sheet 102 and a grease layer 108. Meanwhile, with respect to a cooling component placed on a lower surface of the power semiconductor element 110, a one-layer copper plate 104 is connected with a water-cooling jacket 120 through the intermediary of a cured resin sheet 102 and a grease layer 108. Further, a copper foil, an aluminum foil or the like may be bonded to a surface of the cured resin sheet 102 on the side of the grease layer 108. Although the cured resin sheet 102 and the water-cooling jacket 120 are placed intercalating the grease layer 108 in FIG. 5, the cured resin sheet 102 and the water-cooling jacket 120 may be arranged allowing direct contact each other.

Figure 6:
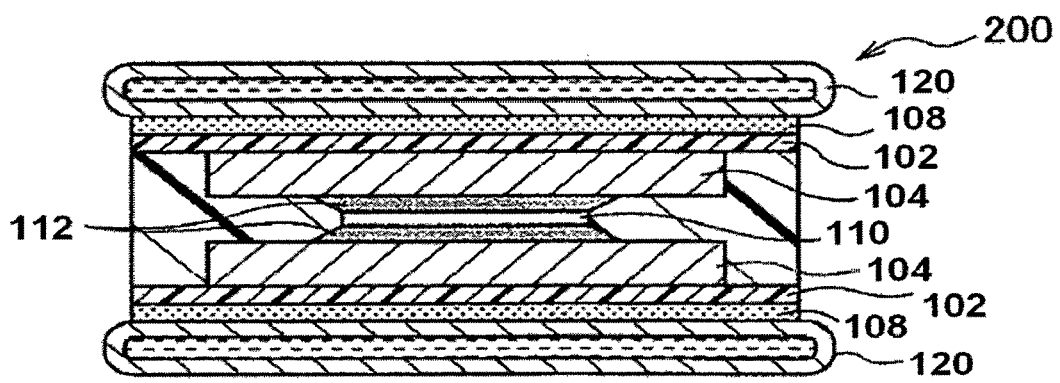
FIG. 6 is a schematic cross-sectional view showing an example of the constitution of a power semiconductor device constituted with a cured resin sheet in the present invention.

FIG. 6 is a schematic sectional view showing an embodiment of a power semiconductor device 200 constituted with cooling components placed on both faces of a power semiconductor element 110. In the power semiconductor device 200, cooling components placed on both faces of the power semiconductor element 110 are constituted respectively including one-layer of copper plate 104. Further, a copper foil, an aluminum foil or the like may be bonded to a surface of the cured resin sheet 102 on the side of the grease layer 108. Although the cured resin sheet 102 and the water-cooling jacket 120 are placed intercalating the grease layer 108 in FIG. 6, the cured resin sheet 102 and the water-cooling jacket 120 may be arranged allowing direct contact each other.

Figure 7:
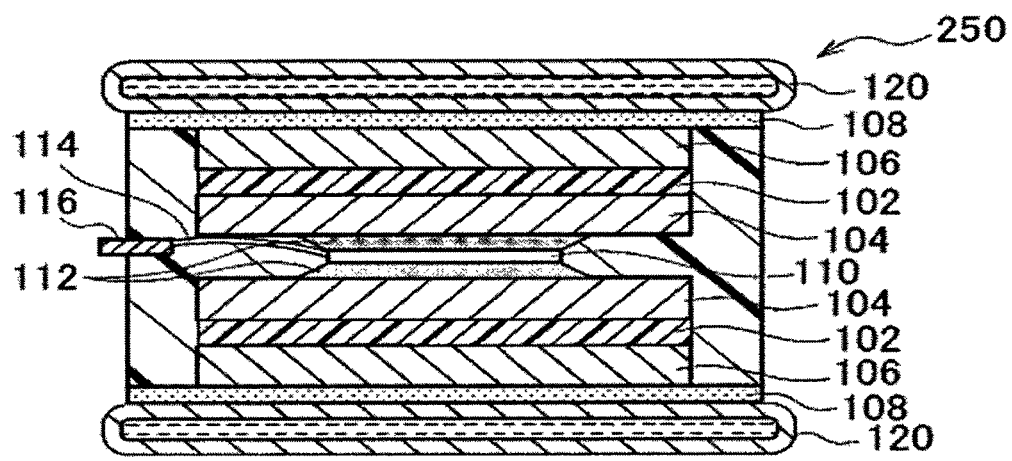
FIG. 7 is a schematic cross-sectional view showing an example of the constitution of a power semiconductor device constituted with a cured resin sheet in the present invention.

FIG. 7 is a schematic sectional view showing an embodiment of a power semiconductor device 250 constituted with cooling components placed on both faces of a power semiconductor element 110. In the power semiconductor device 250, a cooling component placed on an upper surface of the power semiconductor element 110 is constituted with copper plates 104 placed through the intermediary of a solder layer 112. Owing to such a constitution, occurrence of chip cracking and solder cracking can be suppressed effectively. Further by containing a cured resin sheet 102 in a module, an influence of sheet cracking, external vibration or the like can be shielded to improve reliability. In FIG. 7 copper plates 104 placed on the upper surface and the lower surface are connected respectively with water-cooling jackets 120 through the intermediary of cured resin sheets 102, heat dissipation bases 106 and grease layers 108. Examples of a heat dissipation base 106 include a copper foil and an aluminum foil. The power semiconductor element 110 is connected with an external terminal 116 through a wiring component 114. Although the cured resin sheet 102 and the water-cooling jacket 120 are placed intercalating the heat dissipation base 106 placed on the cured resin sheet 102, and the grease layer 108 in FIG. 7, the cured resin sheet 102 and the water-cooling jacket 120 may be arranged allowing direct contact each other.

Figure 8:
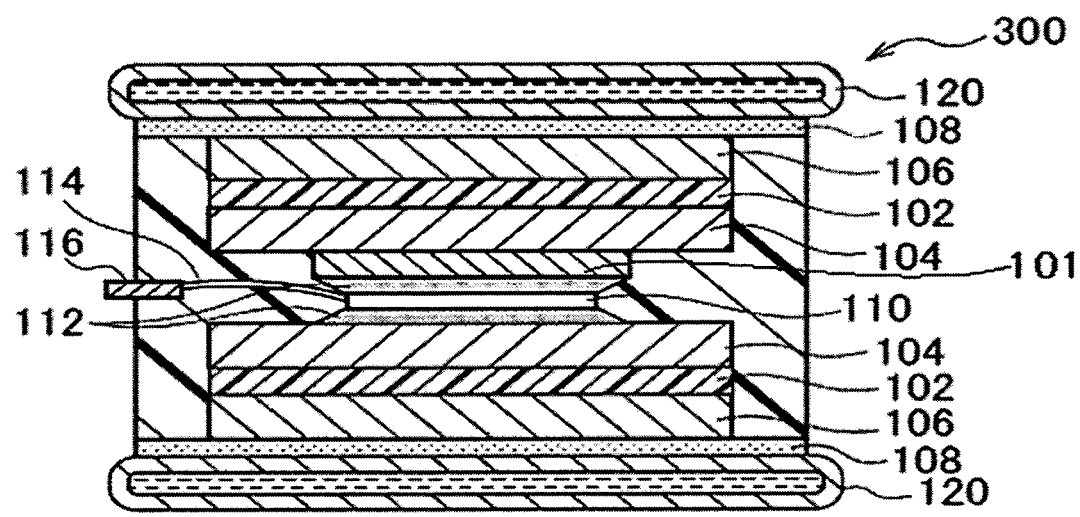
FIG. 8 is a schematic cross-sectional view showing an example of the constitution of a power semiconductor device constituted with a cured resin sheet in the present invention.

FIG. 8 is a schematic sectional view showing an embodiment of a power semiconductor device 300 constituted with cooling components placed on both faces of a power semiconductor element 110. In the power semiconductor device 300, cooling components placed on both faces of the power semiconductor element 110 are constituted respectively including one-layer of copper plate 104. Meanwhile, a copper plate 104 is placed on a face of the power semiconductor element 110 through the intermediary of a spacer 101. Further by containing a cured resin sheet 102 in a module, an influence of sheet cracking, external vibration or the like can be shielded to improve reliability. In FIG. 8, copper plates 104 are connected with water-cooling jackets 120 through the intermediary of cured resin sheets 102, heat dissipation bases 106 and grease layers 108. The power semiconductor element 110 is connected with an external terminal 116 through a wiring component 114. Although the cured resin sheet 102 and the water-cooling jacket 120 are placed intercalating the heat dissipation base 106 placed on the cured resin sheet 102, and the grease layer 108 in FIG. 8, the cured resin sheet 102 and the water-cooling jacket 120 may be arranged allowing direct contact each other.

Figure 9:
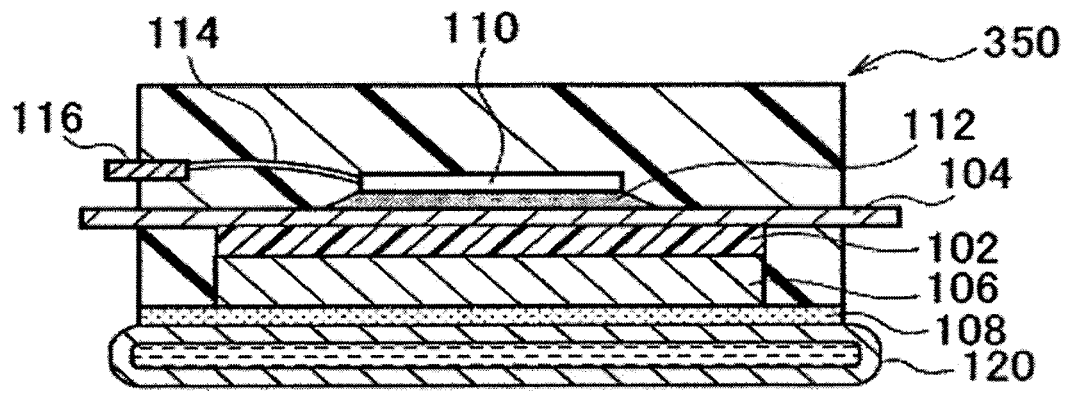
FIG. 9 is a schematic cross-sectional view showing an example of the constitution of a power semiconductor device constituted with a cured resin sheet in the present invention.

FIG. 9 is a schematic sectional view showing an embodiment of a power semiconductor device 350 in which a power semiconductor element 110 is constituted with a copper plate 104 to be placed through the intermediary of a solder layer 112, a cured resin sheet 102, and a heat dissipation base 106, which is placed on a water-cooling jacket 120 through the intermediary of a grease layer 108. Since a heat generator including a power semiconductor element 110 is in contact with a heat dissipation component through the intermediary of a cured resin sheet 102, heat dissipation can be carried out efficiently. In this regard, a heat dissipation base 106 can be constituted with copper, aluminum or the like which have high thermal conductivity.

<LED Device>

An LED device in the present invention includes an LED element, the cured resin sheet and a substrate, layered in this order. An LED device may, if necessary, further include another component. Examples of a substrate include an aluminum substrate.

FIG. 10 to FIG. 13 show embodiments of an LED device to be constituted with a cured resin sheet in the present invention.

Figure 10:
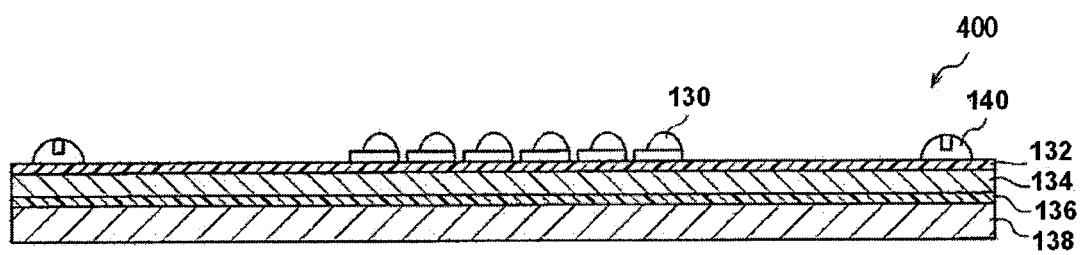
FIG. 10 is a schematic cross-sectional view showing an example of the constitution of an LED light bar constituted with a cured resin sheet in the present invention.

FIG. 10 is a schematic sectional view showing an example of a constitution of an LED light bar 400 constituted with a cured resin sheet in the present invention. An LED light bar 400 is constituted by arranging a housing 138, a grease layer 136, an aluminum substrate 134, a cured resin sheet 132, and LED chips 130, arranging in this order, and fixing them with screws 140. By placing LED chips 130, which are heat generators, on an aluminum substrate 134 through the intermediary of a cured resin sheet 132, heat can be dissipated efficiently.

Figure 11:
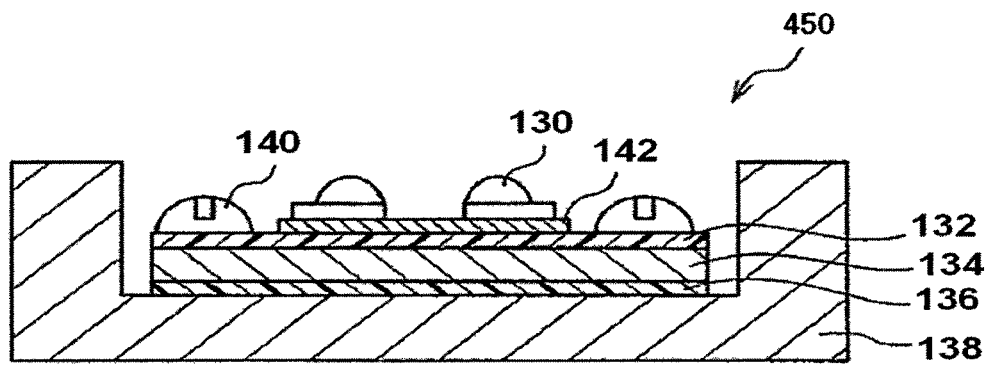
FIG. 11 is a schematic cross-sectional view showing an example of the constitution of an LED bulb constituted with a cured resin sheet in the present invention.
Figure 12:
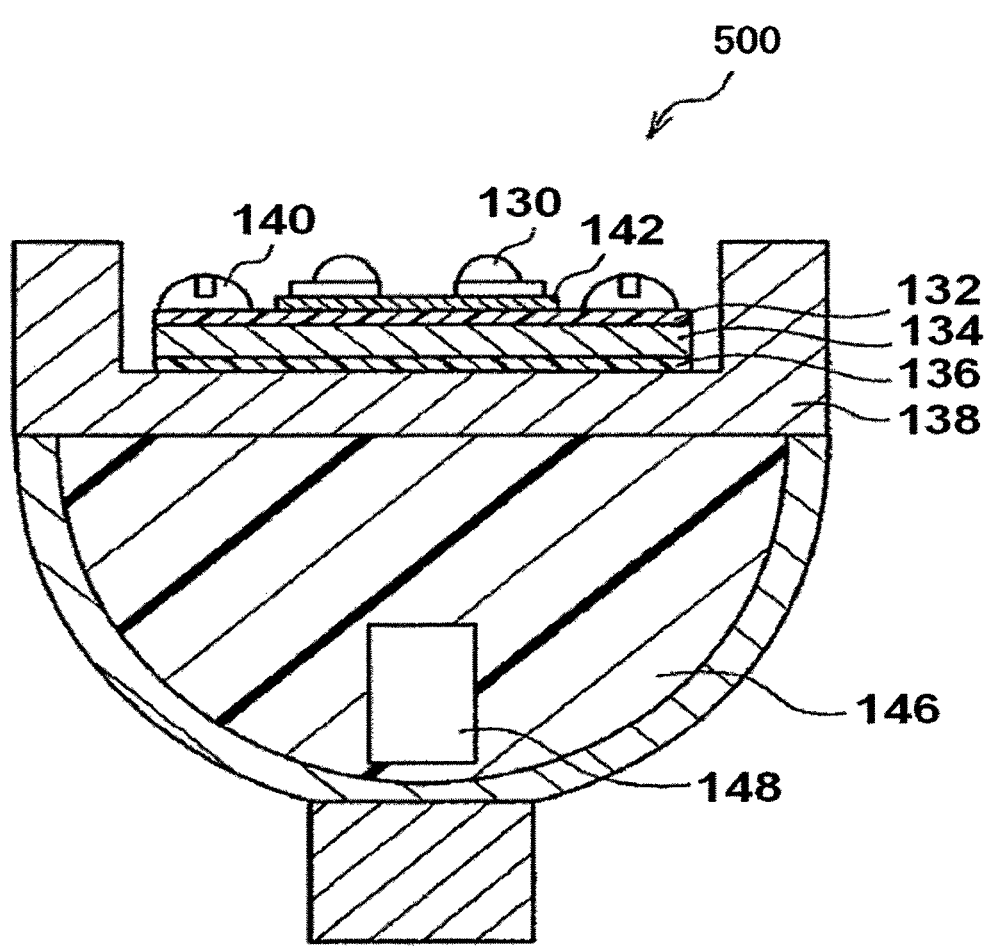
FIG. 12 is a schematic cross-sectional view showing an example of the constitution of an LED bulb constituted with a cured resin sheet in the present invention.

FIG. 11 is a schematic sectional view showing an embodiment of a light emitter 450 of an LED bulb. The light emitter 450 of an LED bulb is constituted by arranging a housing 138, a grease layer 136, an aluminum substrate 134, a cured resin sheet 132, a circuit layer 142, and LED chips 130, arranging in this order, and fixing them with screws 140. FIG. 12 is a schematic sectional view showing an example of an overall constitution of an LED bulb 500. A housing 138 constituting a light emitter of the LED bulb is placed on a sealing resin 146 encapsulating a power source component 148.

Figure 13:
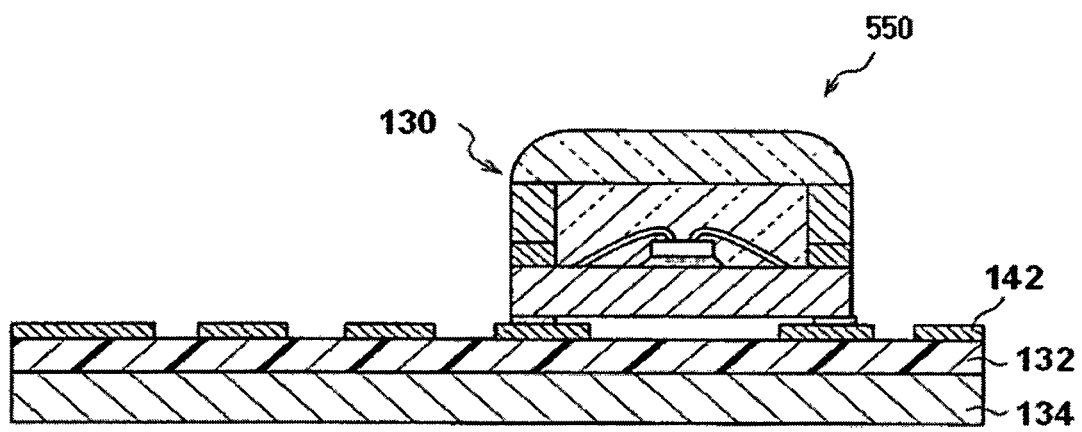
FIG. 13 is a schematic cross-sectional view showing an example of the constitution of an LED substrate constituted with a cured resin sheet in the present invention.

FIG. 13 is a schematic sectional view showing an example of a constitution of an LED substrate 550. The LED substrate 550 is configured by arranging an aluminum substrate 134, a cured resin sheet 132 in the present invention, a circuit layer 142, and an LED chip 130, arranging in this order. By placing an LED chip 130, which is a heat generator, on an aluminum substrate 134 through the intermediary of a circuit layer 142 and a cured resin sheet 132, heat can be dissipated efficiently The disclosure of Japanese Patent Applications No. 2013-134992 is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

EXAMPLES

The present invention will be described more specifically below by way of examples, provided that the present invention be not limited the examples. Meanwhile, the expressions of "part" and "%" herein are by mass, unless otherwise specified.

Materials used for producing a resin sheet and the abbreviations thereof are as follows.

(Filler)

AA-18: aluminum oxide particle, product name: AA-18, volume average particle diameter 18 μm, produced by Sumitomo Chemical Co., Ltd.

AA-3: aluminum oxide particle, product name: AA-3, volume average particle diameter 3 μm, produced by Sumitomo Chemical Co., Ltd.

AA-04: aluminum oxide particle, product name: AA-04, volume average particle diameter 0.4 μm, produced by Sumitomo Chemical Co., Ltd.

HP: boron nitride particle, product name: HP40, volume average particle diameter 45 μm, produced by Mizushima Ferroalloy Co., Ltd.

(Curing Agent (Including Novolac Resin))

CRN: catechol resorcinol novolac resin, number average molecular weight 425, content of phenolic compounds 35%, produced by Hitachi Chemical Co., Ltd.

BPA: biphenyl aralkyl resin, grade number HE200C-10, produced by Air Water Inc.

PN: phenol novolac resin, grade number HP850N, number average molecular weight 630, produced by Hitachi Chemical Co., Ltd.

PA: phenolic aralkyl resin, grade number MEH-7800 (SS), produced by Meiwa Plastic Industries, Ltd.

NA: naphthol aralkyl resin, grade number SN375, produced by Nippon Steel & Sumitomo Metal Corporation TPM: triphenylmethane novolac resin, HE910-10, produced by Air Water Inc.

(Epoxy Resin)

PNAP: triphenylmethane epoxy resin, product name: EPPN-502H, produced by Nippon Kayaku Co., Ltd.

BIS-A/F: bisphenol A/F mixture epoxy resin, grade number ZX-1059, produced by Nippon Steel & Sumitomo Metal Corporation BPE: biphenyl epoxy resin, grade number YL6121H, produced by Mitsubishi Chemical Corporation (Additive)

TPP: triphenylphosphine (curing catalyst), produced by Wako Pure Chemical Industries, Ltd.

PAM: 3-phenyl aminopropyltrimethoxysilane (silane coupling agent), product name: KBM-573, produced by Shin-Etsu Chemical Co., Ltd.

(Organic Solvent)

CHN: cyclohexanone (extra pure reagent), produced by Wako Pure Chemical Industries, Ltd.

(Support)

PET film: product name A31, produced by Teijin DuPont Films Japan Limited.

Copper foil: product name GTS 080, thickness 80 μm, produced by Furukawa Electric Co., Ltd.

Synthesis Example (Synthesis of Novolac Resin)

In a nitrogen atmosphere, 105 g of resorcinol and 5 g of catechol as phenolic compound monomers, 0.11 g of oxalic acid as a catalyst (0.1% with respect to the monomer), and 15 g of methanol as a solvent were weighed out respectively into a separable flask, which content was stirred and 30 g of formalin was added with cooling in a oil bath to 40° C. or less. After stirring for 2 hours, the temperature of the oil bath was raised to 100° C. for heating and water and methanol were distilled away under reduced pressure. After confirming that distillation of water and methanol was completed CHN was added to the final concentration of a novolac resin of 35% to obtain a catechol resorcinol novolac resin solution (CRN).

By a molecular weight measurement of the obtained product by GPC, the number average molecular weight and the monomer content were quantitatively analyzed. Further, by an analysis of a NMR spectrum on the obtained product, it was confirmed that a structural unit represented by Formula (I) was included. In this regard, conditions for a GPC analysis and a NMR analysis are described below.

Example 1

(Preparation of resin sheet)

First, 29.94 parts of a mixture of aluminum oxide particles (AA-18:AA-3:AA-04; volume-based mixture ratio 1.0:1.0), 38.6 parts of HP (volume-based mixture ratio with respect to AA-04=7.0), 0.069 part of a silane coupling agent (PAM), 5.72 parts of CRN as a curing agent for an epoxy resin, 1.28 parts of BPA, and 15.5 parts of CHN were mixed. After confirming uniform mixing, 4.37 parts of PNAP and 4.42 parts of BIS-A/F as epoxy resin monomers, and 0.1 part of TPP were further added, and the content was mixed, and then ground with a ball mill for from 20 hours to 40 hours to obtain a coating liquid for forming a resin layer as a resin composition. The filler content with respect to the total solid volume in a resin composition was approximately 70% by volume.

Using a PET (polyethylene terephthalate) film (A31, thickness 50 μm, produced by Teijin DuPont Films Japan Limited), a single surface of which was mold-release-treated, (hereinafter also referred to simply as "PET film") as a support, the coating liquid for forming a resin layer was coated on the mold-release-treated surface by a comma coater (produced by Hirano Tecseed Co., Ltd.) to form a coat layer with a thickness of approximately 150 μm. After drying in a box type oven at 100° C. for 5 min, a resin sheet, in which a resin layer in an A-stage was formed on the PET film, (hereinafter also referred to as "A-stage sheet") was formed.

Two pieces of the thus obtained A-stage sheets were combined such that the resin layers faced each other. The sheets were hot-pressed using a heat press (hot plate 150° C., pressure 10 MPa, treatment time 1 min, degree of vacuum 1 kPa or less) to be bonded together, and a resin sheet in a B-stage (hereinafter also referred to as "B-stage sheet") with an average thickness of 198 μm was obtained.

(Production of Cured Resin Sheet Structure)

The PET films were peeled off from both faces of the obtained B-stage sheet, and copper foils with a thickness of 80 μm (GTS grade, thickness 80 μm, produced by Furukawa Electric Co., Ltd.) were placed on both the faces respectively, and subjected to a press treatment. Pressing conditions were a hot plate temperature of 165° C., a degree of vacuum of 1 kPa or less, a pressure of 10 MPa, and a treatment time of 3 min. Then a heat treatment was conducted in a box type oven at 140° C. for 2 hours, at 165° C. for 2 hours, and at 190° C. for 2 hours, successively, to yield a cured resin sheet structure 1 in a C-stage with copper foils placed on both faces.

Example 2

A resin sheet in an A-stage, a resin sheet in a B-stage, and a cured resin sheet structure 2 in a C-stage with copper foils placed on both faces were respectively produced identically with Example 1 except that 25.5 parts of aluminum oxide particle mixture (AA-18:AA-3:AA-04; volume-based mixture ratio 0.5:1.0:1.0), 42.3 parts of HP (volume-based mixture ratio with respect to AA-04=7.5) were used in contrast to Example 1 and the contents of other components were changed to the amounts set forth in Table 1.

Example 3

A resin sheet in an A-stage, a resin sheet in a B-stage, and a cured resin sheet structure 3 in a C-stage with copper foils placed on both faces were respectively produced identically with Example 1 except that 38.2 parts of aluminum oxide particle mixture (AA-18:AA-3:AA-04; volume-based mixture ratio 2.0:1.0:1.0), 31.7 parts of HP (volume-based mixture ratio with respect to AA-04=6.0) were used and the contents of other components were changed to the amounts set forth in Table 1.

Example 4

A resin sheet in an A-stage, a resin sheet in a B-stage, and a cured resin sheet structure 4 in a C-stage with copper foils placed on both faces were respectively produced identically with Example 1 except that 52.8 parts of aluminum oxide particle mixture (AA-18:AA-3:AA-04; volume-based mixture ratio 2.6:2.4:1.0), 19.5 parts of HP (volume-based mixture ratio with respect to AA-04=4.0) were used and the contents of other components were changed to the amounts set forth in Table 1.

Example 5

A resin sheet in an A-stage, a resin sheet in a B-stage, and a cured resin sheet structure 5 in a C-stage with copper foils placed on both faces were respectively produced identically with Example 1 except that 59.3 parts of aluminum oxide particle mixture (AA-18:AA-3:AA-04; volume-based mixture ratio 3.6:2.4:1.0), and 14.0 parts of HP (volume-based mixture ratio with respect to AA-04=3.0) were used.

Example 6

A resin sheet in an A-stage, a resin sheet in a B-stage, and a cured resin sheet structure 6 in a C-stage with copper foils placed on both faces were respectively produced identically with Example 1 except that only 8.89 parts of BPE as an epoxy resin, as well as 5.59 parts of CRN, and 1.22 parts of BPA were used.

Example 7

A resin sheet in an A-stage, a resin sheet in a B-stage, and a cured resin sheet structure 7 in a C-stage with copper foils placed on both faces were respectively produced identically with Example 3 except that only 8.51 parts of BPE as an epoxy resin, as well as 5.35 parts of CRN, and 1.17 parts of BPA were used.

Example 8

A coating liquid for forming a resin layer obtained in Example 7 was applied with a comma coater on to a copper foil with a thickness of 80 μm to form a coat layer with a thickness of approximately 140 μm. After drying in a box type oven at 100° C. for 5 min, a resin sheet (A-stage sheet), which was a resin layer in an A-stage formed on a copper foil, was formed. Further, the coating liquid was applied on to a releasing surface of a PET film to a thickness of approximately 140 μm, dried in a box type oven at 100° C. for 5 min to form a resin sheet in an A-stage on the PET film.

A piece of the A-stage sheet with a resin layer formed on a copper foil and a piece of the A-stage sheet with a resin layer formed on a PET film obtained as above were combined such that the resin layers faced each other. The sheets were hot-pressed using a heat press (hot plate 150° C., pressure 10 MPa, treatment time 1 min, degree of vacuum 1 kPa or less) to be bonded together, and a resin layer sheet in a B-stage (B-stage sheet) with a thickness of approximately 193 μm was obtained.

(Production of Cured Resin Sheet Structure)

The PET film was peeled off from a face of the obtained B-stage sheet, and a copper foil with a thickness of 80 μm (GTS grade, thickness 80 μm, produced by Furukawa Electric Co., Ltd.) was placed on the peeled surface, and subjected to a press treatment. Pressing conditions were a hot plate temperature of 165° C., a degree of vacuum of 1 kPa or less, a pressure of 10 MPa, and a treatment time of 3 min. A heat treatment was conducted in a box type oven at 140° C. for 2 hours, at 165° C. for 2 hours, and at 190° C. for 2 hours, successively, to yield a cured resin sheet structure 8 in a C-stage with copper foils placed on both faces.

Example 9

A resin sheet in an A-stage, a resin sheet in a B-stage, and a cured resin sheet structure 9 in a C-stage with copper foils placed on both faces were respectively produced identically with Example 1 except that 85.97 parts of aluminum oxide particle mixture (AA-18:AA-3:AA-04; volume-based mixture ratio 4.6:3.4:1.0), 5.28 parts of HP (volume-based mixture ratio with respect to AA-04=1.0) were used in contrast to Example 1 and the contents of other components were changed to the amounts set forth in Table 1.

Comparative Example 1

(Preparation of Resin Sheet)

First, 76 parts of an aluminum oxide mixture (AA-18: AA-3:AA-04; volume-based mixture ratio 6.6:2.4:1.0), 0.076 part of a silane coupling agent (PAM; KBM-573), 4.36 parts of a CHN solution of CRN (solid content 50%) as a curing agent for an epoxy resin, 0.95 part of BPA, and 11.8 parts of CHN were mixed. After confirming uniform mixing, 3.33 parts of PNAP and 3.37 parts of BIS-A/F, as epoxy resin monomers, and 0.08 part of TPP were further added, and the content was mixed, and then ground with a ball mill for from 20 hours to 40 hours to obtain a coating liquid for forming a thermally conductive layer as a resin composition.

The obtained coating liquid for forming a thermally conductive layer was coated on a releasing surface of a PET film by a comma coater (produced by Hirano Tecseed Co., Ltd.) to form a coat layer with a thickness of approximately 110 μm. After drying in a box type oven at 100° C. for 15 min to form a resin layer on the PET film, a resin sheet in an A-stage was obtained (A-stage sheet). Two pieces of the thus obtained A-stage sheets were combined such that the resin layers faced each other. The sheets were bonded together by a press treatment under the conditions of a temperature of 130° C., a pressure of 1 MPa, a degree of vacuum of 1 kPa or less, and duration of 15 sec, then the PET films were peeled off to obtain a resin sheet in a B-stage (B-stage sheet) with a thickness of 192 μm.

(Production of Cured Resin Sheet Structure)

The PET films were peeled from both faces of the obtained B-stage sheet, and copper foils with a thickness of 80 μm (GTS grade, thickness 80 μm, produced by Furukawa Electric Co., Ltd.) were placed on both the faces, and subjected to a press treatment. Pressing conditions were a hot plate temperature of 165° C., a degree of vacuum of 1 kPa or less, a pressure of 10 MPa, and a treatment time of 3 min. Then a heat treatment was conducted in a box type oven at 140° C. for 2 hours, at 165° C. for 2 hours, and at 190° C. for 2 hours, successively, to yield a cured resin sheet structure C1 in a C-stage with copper foils placed on both faces.

Comparative Example 2

A resin sheet in an A-stage, a resin sheet in a B-stage, and a cured resin sheet structure C2 in a C-stage with copper foils placed on both faces were respectively produced identically with Comparative Example 1 except the following points: 33.3 parts of an aluminum oxide mixture (AA-3: AA-04; volume-based mixture ratio 2.4:1.0), 35.8 parts of HP (volume-based mixture ratio with respect to AA-04=6.6), 0.069 part of a silane coupling agent (PAM; KBM-573), 5.62 parts of a CHN solution of CRN (solid content 50%) as a curing agent for an epoxy resin, 1.23 parts of BPA, and 15.2 parts of CHN were mixed; the content was confirmed uniform mixing, 4.29 parts of PNAP and 4.34 parts of BIS-A/F as epoxy resin monomers, and 0.10 part of TPP were further added; and the content was mixed.

Comparative Example 3

A resin sheet in an A-stage, a resin sheet in a B-stage, and a cured resin sheet structure C3 in a C-stage with copper foils placed on both faces were respectively produced identically with Comparative Example 1 except the following points: 52.8 parts of an aluminum oxide mixture (AA-18: AA-3; volume-based mixture ratio with respect to total filler volume=36% by volume: 24% by volume), 19.45 parts of HP (volume-based mixture ratio with respect to total filler volume=40% by volume), 0.072 part of a silane coupling agent (PAM; KBM-573), 5.04 parts of a CHN solution of CRN (solid content 50%) as a curing agent for an epoxy resin, 1.10 parts of BPA, and 13.6 parts of CHN were mixed; the content was confirmed uniform mixing; 3.85 parts of PNAP and 3.90 parts of BIS-A/F as epoxy resin monomers, and 0.09 part of TPP were further added, and the content was mixed.

Comparative Example 4

A resin sheet in an A-stage, a resin sheet in a B-stage, and a cured resin sheet structure C4 in a C-stage with copper foils placed on both faces were respectively produced identically with Comparative Example 1 except the following points: 52.8 parts of an aluminum oxide mixture (AA-18: AA-04; volume-based mixture ratio with respect to total filler volume=36% by volume: 24% by volume), 19.45 parts of HP (volume-based mixture ratio with respect to total filler volume=40% by volume), 0.072 part of a silane coupling agent (PAM; KBM-573), 5.04 parts of a CHN solution of CRN (solid content 50%) as a curing agent for an epoxy resin, 1.10 parts of BPA, and 13.6 parts of CHN were mixed; the content was confirmed uniform mixing; 3.85 parts of PNAP and 3.90 parts of BIS-A/F as epoxy resin monomers, and 0.09 part of TPP were further added; and the content was mixed.

Comparative Example 5

First, 54.2 parts of an aluminum oxide mixture (AA-18: AA-3:AA-04; volume-based mixture ratio 2.6:2.4:1.0), 20.0 parts of HP (volume-based mixture ratio with respect to AA-04=4.0), 0.074 part of a silane coupling agent PAM, 4.50 parts of PN as a curing agent for an epoxy resin, and 14.0 parts of CHN were mixed, and after confirming uniform mixing, 3.56 parts of PNAP and 3.61 parts of BIS-A/F, as epoxy resin monomers, and 0.093 part of TPP were further added, and the content was mixed, and then agitated with a ball mill for from 20 hours to 40 hours to obtain a coating liquid for forming a thermally conductive layer as a resin composition.

The obtained coating liquid for forming a thermally conductive layer was coated on a releasing surface of a PET film by a comma coater to form a coat layer with a thickness of approximately 110 µm, and dried in a box type oven at 100° C. for 15 min to form a resin layer on the PET film. Two sheets of the thus obtained coated film with a thermally conductive layer formed were combined such that the resin layers faced each other and bonded together with a laminator under the conditions of a temperature of 150° C., a pressure of 10 MPa, a degree of vacuum of 1 kPa or less, and duration of 15 sec, then the PET films were peeled off to obtain a resin sheet in a B-stage (B-stage sheet) with a thickness of 190 µm.

(Production of Cured Resin Sheet Structure)

The PET films were peeled off from both faces of the obtained B-stage sheet, and copper foils with a thickness of 80 µm (GTS grade, thickness 80 µm, produced by Furukawa Electric Co., Ltd.) were placed on both the faces, and subjected to a press treatment. Pressing conditions were a hot plate temperature of 165° C., a degree of vacuum of 1 kPa or less, a pressure of 10 MPa, and a treatment time of 3 min. Then a heat treatment was conducted in a box type oven at 140° C. for 2 hours, at 165° C. for 2 hours, and at 190° C. for 2 hours, successively, to yield a cured resin sheet structure C5 in a C-stage with copper foils placed on both faces.

Comparative Example 6

A cured resin sheet structure C6 placed with copper foils on both faces in a C-stage was produced identically with Comparative Example 5, except that 5.93 parts of PA as a curing agent for an epoxy resin, and 2.85 parts of PNAP and 2.88 parts of BIS-A/F as epoxy resin monomers were used.

Comparative Example 7

A cured resin sheet structure C7 placed with copper foils on both faces in a C-stage was produced identically with Comparative Example 5, except that 4.34 parts of NA as a curing agent for an epoxy resin, and 3.64 parts of PNAP and 3.69 parts of BIS-A/F as epoxy resin monomers were used.

Comparative Example 8

A cured resin sheet structure C8 placed with copper foils on both faces in a C-stage was produced identically with Comparative Example 5, except that 4.42 parts of TPM as a curing agent for an epoxy resin, and 3.60 parts of PNAP and 3.64 parts of BIS-A/F as epoxy resin monomers were used.

Comparative Example 9

A resin sheet in an A-stage, a resin sheet in a B-stage, and a cured resin sheet structure C9 in a C-stage with copper foils placed on both faces were respectively produced identically with Comparative Example 1 except the following points: First, 54.2 parts of an aluminum oxide mixture (AA-18:AA-3:AA-04; volume-based mixture ratio 2.6:2.4: 1.0), 20.0 parts of HP (volume-based mixture ratio with respect to AA-04=4.0), 0.074 part of a silane coupling agent (PAM; KBM-573), 6.32 parts of BPA as a curing agent for an epoxy resin, and 14.0 parts of CHN were mixed; the content was confirmed uniform mixing, 2.66 parts of PNAP and 2.69 parts of BIS-A/F as epoxy resin monomers, and 0.099 part of TPP were further added; and the content was mixed.

Comparative Example 10

A resin sheet in an A-stage, a resin sheet in a B-stage, and a cured resin sheet structure C10 in a C-stage with copper foils placed on both faces were respectively produced identically with Comparative Example 1 except the following points: 54.2 parts of an aluminum oxide mixture (AA-18:AA-3:AA-04; volume-based mixture ratio 2.6:2.4:1.0), 20.0 parts of HP (volume-based mixture ratio with respect to AA-04=4.0), 0.074 part of a silane coupling agent (PAM; KBM-573), 1.34 parts of PN and 5.35 parts of BPA as curing agents for an epoxy resin, and 14.8 parts of CHN were mixed; the content was confirmed uniform mixing, 2.80 parts of PNAP and 2.84 parts of BIS-A/F as epoxy resin monomers, and 0.099 part of TPP were further added; and the content was mixed.

<Evaluation>

For the CRN, the A-stage resin sheet, the B-stage resin sheet, and the C-stage cured resin sheet structure produced as above, the following evaluations were carried out. The evaluation results are shown in Table 1 and Table 2. In this regard, a unit for the resin composition values in Table 1 and Table 2 is parts by mass.

(GPC Measurement)

The CRN yielded in the synthesis example was dissolved in tetrahydrofuran (for liquid chromatography use) and passed through a filter made of PTFE (CHROMATODISK, grade number: 13N, for HPLC pretreatment, pore size: 0.45 µm, produced by Kurabo Industries Ltd.) to remove insolubles. A GPC unit [Pump: L6200 pump (produced by Hitachi, Ltd.), Detector: differential refractive index detector L3300 RI MONITOR (produced by Hitachi, Ltd.), Column: TSKGEL-G5000HXL and TSKGEL-G2000HXL, the two (both produced by Tosoh Corporation) being connected in series, Column temperature: 30° C., Eluent: tetrahydrofuran, Flow rate: 1.0 mL/min, Reference material: polystyrene, and Detector: RI] was used and a number average molecular weight was determined through molecular weight measurements. The monomer content in the CRN was also calculated based on an NMR measurement.

(NMR Measurement)

The CRN yielded in the synthesis example was dissolved in deuterated dimethyl sulfoxide (DMSO-$d_6$) and $^1$H-NMR spectrum was measured by a proton nuclear magnetic resonance method ($^1$H-NMR) using AV-300 (300 MHz; produced by Bruker Corporation). As for the chemical shift reference, tetramethylsilane, which is an internal reference substance, was set at 0 ppm.

(Thermal Conductivity Coefficient of Cured Resin Sheet)

From a cured resin sheet structure in a C-stage produced as above, a copper foil was removed by etching using a sodium persulfate solution. The product was cut to a chip of 10 mm-square, subjected to a blackening treatment with a graphite spray, and thermal diffusivity was measured with a LFA447 NANOFLASH produced by Netzsch-Geraetebau GmbH.

Measurement conditions were set at a measurement temperature of 25±1° C., a measurement voltage of 270 V, an amplitude of 5000, and a pulse width of 0.06 ms.

A thermal conductivity coefficient was calculated by multiplying a thermal diffusivity measured as above, a density measured by an Archimedes' method with an electronic densimeter (SD-200L, produced by Alfa Mirage Co., Ltd.), and a specific heat measured by a DSC (differential calorimeter PYRIS 1, produced by PerkinElmer, Inc.).

(Peel Strength)

—For B-Stage Sheet with PET Films on Both Faces—

PET films were peeled from both faces of a B-stage sheet in a size of 100 mm×100 mm×0.2 mm, and copper foils in a size of 100 mm×100 mm×0.035 mm were placed on both the faces and bonded together by pressing, and then treated for curing to a C-stage. The product was cut to smaller pieces of 100 mm×25 mm, one face thereof was protected, and the copper foil on the other face was removed by an etching treatment to prepare a copper pattern of 100 mm×10 mm. The peel strength of the copper foil was measured by pulling the copper pattern with a model AGC-100 of Shimadzu Corporation at a measurement temperature of 23° C. and at a test speed of 50 mm/min. For each sample 4 measurements were performed and the average value was taken as the peel strength.

In this regard, bonding and curing treatments were carried out as follows. A copper plate was bonded by performing a vacuum hot press (hot plate temperature 165° C., degree of vacuum 1 kPa or less, pressure 4 MPa, and treatment time 3 min), and thereafter a curing treatment was performed by a stepwise cure in a box type oven at 140° C. for 2 hours, at 165° C. for 2 hours, and at 190° C. for 2 hours.

—For B-Stage Sheet with Copper Foil on One Face and PET Film on the Other Face—

A PET film was peeled from a face of a B-stage sheet with a copper foil on a single face in a size of 100 mm×100 mm×0.2 mm, and a copper foil in a size of 100 mm×100 mm×0.035 mm was placed on the bare face and bonded together by pressing, and then treated for curing to a C-stage. The product was cut to smaller pieces of 100 mm×25 mm, the copper foil previously bonded to the B-stage sheet was protected, and the copper foil on the other face was etched to prepare a copper pattern of 100 mm×10 mm. The peel strength of the copper foil was measured by pulling the copper pattern with a model AGC-100 of Shimadzu Corporation at a measurement temperature of 23° C. and at a test speed of 50 mm/min. For each sample 4 measurements were performed and the average value was taken as the peel strength.

In this regard, bonding and curing treatment conditions were the same as above.

(Average Thickness of A-Stage Sheet)

The average thickness of an A-stage sheet was measured as follows. With respect to each Example, each of 2 pieces of A-stage sheet was cut to a 100 mm-square sheet without removing a support, and the thickness thereof was measured at 9 points with a micrometer IP65 produced by Mitutoyo Corporation. Assuming that the thicknesses of a PET film and a copper foil as a support were not changed by curing to a B-stage, the thickness of a resin layer is determined by subtracting the support thickness, and the arithmetic mean value was taken as the average thickness of each resin sheet. In this regard, one of the 2 pieces of A-stage sheet was denoted as an A-side resin sheet, and the other was denoted as a B-side resin sheet.

(Average Thickness of B-Stage Sheet)

The average thickness of a B-stage sheet was measured as follows. A B-stage sheet was cut to a 100 mm-square sheet without removing a support, and the thickness thereof was measured at 9 points with a micrometer IP65 produced by Mitutoyo Corporation. Assuming that the thicknesses of a PET film and an aluminum foil as a support were not changed by curing to a B-stage, the thickness of a resin layer is determined by subtracting the support thickness, and the arithmetic mean value was taken as the average thickness of each B-stage sheet.

(Average Thickness of Cured Resin Sheet)

A copper foil was removed by etching using a sodium persulfate solution from the cured resin sheet structure in a C-stage produced above. Thus, a cured resin sheet was obtained. The cured resin sheet was cut to a 100 mm-square sheet, and the thickness thereof was measured at 9 points with a micrometer IP65 produced by Mitutoyo Corporation. The arithmetic mean value was taken as the average thickness of the cured resin sheet.

TABLE 1

| Item | | | Examples | | | | | | | | |
|---|---|---|---|---|---|---|---|---|---|---|---|
| | | No. | 1 | 2 | 3 | 4 | 5 | 6 | 7 | 8 | 9 |
| Mass ratio | Filler | AA-04 | 9.98 | 10.2 | 9.55 | 8.80 | 8.47 | 9.98 | 9.55 | 9.55 | 9.55 |
| | | AA-3 | 9.98 | 10.2 | 9.55 | 21.1 | 20.3 | 9.98 | 9.55 | 9.55 | 32.48 |
| | | AA-18 | 9.98 | 5.10 | 19.1 | 22.9 | 30.5 | 9.98 | 19.1 | 19.1 | 43.94 |
| | | HP | 38.6 | 42.3 | 31.7 | 19.5 | 14.0 | 38.6 | 31.7 | 31.7 | 5.28 |
| | Epoxy resin | BPE | 0 | 0 | 0 | 0 | 0 | 8.89 | 8.51 | 8.51 | 0 |
| | | PNAP | 4.37 | 4.47 | 4.18 | 3.85 | 3.70 | 0 | 0 | 0 | 4.18 |
| | | BIS-A/F | 4.42 | 4.52 | 4.23 | 3.90 | 3.75 | 0 | 0 | 0 | 4.23 |
| | Curing agent | CRN | 5.72 | 5.85 | 5.47 | 5.04 | 4.85 | 5.59 | 5.35 | 5.35 | 5.48 |
| | | BPA | 1.28 | 1.28 | 1.19 | 1.10 | 1.06 | 1.22 | 1.17 | 1.17 | 1.19 |
| | | PN | 0 | 0 | 0 | 0 | 0 | 0 | 0 | 0 | 0 |
| | | PA | 0 | 0 | 0 | 0 | 0 | 0 | 0 | 0 | 0 |
| | | NA | 0 | 0 | 0 | 0 | 0 | 0 | 0 | 0 | 0 |
| | | TPM | 0 | 0 | 0 | 0 | 0 | 0 | 0 | 0 | 0 |
| | Coupling agent | KBM-573 | 0.069 | 0.068 | 0.070 | 0.072 | 0.073 | 0.069 | 0.070 | 0.070 | 0.091 |
| | Catalyst | TPP | 0.10 | 0.10 | 0.10 | 0.10 | 0.10 | 0.10 | 0.10 | 0.10 | 0.10 |
| | Solvent | CHN | 15.5 | 15.8 | 14.8 | 13.6 | 13.1 | 15.5 | 14.8 | 14.8 | 14.8 |
| A-stage | Thickness of A-side resin sheet | μm | 106 | 108 | 107 | 106 | 107 | 104 | 105 | 107 | 105 |
| | Thickness of B-side resin sheet | μm | 110 | 109 | 104 | 112 | 109 | 106 | 104 | 107 | 108 |
| | Coating substrate type | — | PET | PET | PET | PET | PET | PET | PET | Copper foil | PET |
| B-stage | Thickness | μm | 198 | 201 | 199 | 198 | 200 | 192 | 193 | 193 | 190 |
| C-stage | Thickness | μm | 192 | 195 | 191 | 194 | 193 | 185 | 188 | 188 | 187 |
| | Thermal conductivity coefficient | W/mK | 12.4 | 14.8 | 13.6 | 11.3 | 8.4 | 15.4 | 17.8 | 17.5 | 7.2 |
| | Peel strength | kN/m | 0.6 | 0.6 | 0.8 | 1.2 | 1.3 | 0.8 | 0.8 | 0.8 | 1.6 |

TABLE 2

| Item | | | Comparative Examples | | | | | | | | | |
|---|---|---|---|---|---|---|---|---|---|---|---|---|
| | | No | 1 | 2 | 3 | 4 | 5 | 6 | 7 | 8 | 9 | 10 |
| Mass ratio | Filler | AA-04 | 7.6 | 9.8 | 0.0 | 21.1 | 9.0 | 9.0 | 9.0 | 9.0 | 9.0 | 9.0 |
| | | AA-3 | 18.2 | 23.5 | 21.1 | 0.0 | 21.7 | 21.7 | 21.7 | 21.7 | 21.7 | 21.7 |
| | | AA-18 | 50.2 | 0.00 | 31.7 | 31.7 | 23.5 | 23.5 | 23.5 | 23.5 | 23.5 | 23.5 |
| | | HP | 0 | 35.8 | 19.45 | 19.45 | 20.0 | 20.0 | 20.0 | 20.0 | 20.0 | 20.0 |
| | Epoxy resin | BPE | 0 | 0 | 0 | 0 | 0 | 0 | 0 | 0 | 0 | 0 |
| | | PNAP | 3.33 | 4.29 | 3.85 | 3.85 | 3.56 | 2.85 | 3.64 | 3.60 | 2.66 | 2.80 |
| | | BIS-A/F | 3.37 | 4.34 | 3.90 | 3.90 | 3.61 | 2.88 | 3.69 | 3.64 | 2.69 | 2.84 |
| | Curing agent | CRN | 4.36 | 5.62 | 5.04 | 5.04 | 0 | 0 | 0 | 0 | 0 | 0 |
| | | BPA | 0.95 | 1.23 | 1.10 | 1.10 | 0 | 0 | 0 | 0 | 6.32 | 5.35 |
| | | PN | 0 | 0 | 0 | 0 | 4.50 | 0 | 0 | 0 | 0 | 1.34 |
| | | PA | 0 | 0 | 0 | 0 | 0 | 5.93 | 0 | 0 | 0 | 0 |
| | | NA | 0 | 0 | 0 | 0 | 0 | 0 | 4.34 | 0 | 0 | 0 |
| | | TPM | 0 | 0 | 0 | 0 | 0 | 0 | 0 | 4.42 | 0 | 0 |
| | Coupling agent | KBM-573 | 0.076 | 0.069 | 0.072 | 0.072 | 0.074 | 0.074 | 0.074 | 0.074 | 0.074 | 0.074 |
| | Catalyst | TPP | 0.08 | 0.10 | 0.09 | 0.09 | 0.093 | 0.093 | 0.093 | 0.093 | 0.099 | 0.099 |
| | Solvent | CHN | 11.8 | 15.2 | 13.6 | 13.6 | 14.0 | 14.0 | 14.0 | 14.0 | 14.0 | 14.8 |
| A-stage | Thickness of A-side resin sheet | μm | 103 | 100 | 105 | 107 | 101 | 100 | 99 | 100 | 98 | 94 |
| | Thickness of B-side resin sheet | μm | 102 | 98 | 105 | 108 | 102 | 97 | 101 | 99 | 99 | 96 |
| | Coating substrate type | — | PET | PET | PET | PET | PET | PET | PET | PET | PET | PET |
| B-stage | Thickness | μm | 192 | 194 | 195 | 198 | 190 | 188 | 189 | 188 | 191 | 189 |
| C-stage | Thickness | μm | 189 | 190 | 192 | 197 | 186 | 184 | 187 | 186 | 188 | 184 |
| | Thermal conductivity coefficient | W/mK | 3.7 | 10.2 | 5.3 | 3.8 | 9.2 | 9.4 | 9.1 | 8.9 | 4.2 | 3.5 |
| | Peel strength | kN/m | 1.2 | 0.1 | 0.2 | 0.1 | 0.4 | 0.4 | 0.1 | 0.2 | 1.4 | 0.9 |

It is obvious from Table 1 and Table 2 that a resin sheet in a B-stage formed from a resin composition containing a filler with a specific constitution, and a novolac resin containing a compound including a structural unit represented by Formula (I), and a cured resin sheet in a C-stage, which is a cured product of the resin sheet, have respectively superior thermal conductivity as well as superior adhesive strength.

The invention claimed is:
1. A resin composition comprising an epoxy resin monomer, a novolac resin including a compound having a structural unit represented by the following Formula (I), and a filler;
   wherein the filler has at least 4 peaks in a particle size distribution measured by laser diffractometry, wherein four of the peaks are present respectively in ranges of not less than 0.01 μm and less than 1 μm, not less than

1 μm and less than 10 μm, from 10 μm to 50 μm, and from 20 μm to 100 μm, and wherein a peak present in a range of from 10 μm to 50 μm includes an aluminum oxide particle, and a peak present in a range of from 20 μm to 100 μm includes a boron nitride particle,

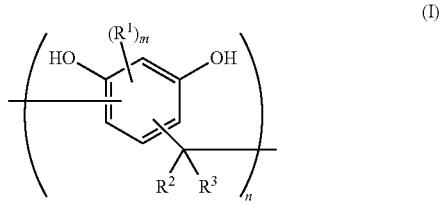

wherein in Formula (I), $R^1$ represents an alkyl group, an aryl group or an aralkyl group; each of $R^2$ and $R^3$ independently represents a hydrogen atom, an alkyl group, an aryl group or an aralkyl group; m represents a number from 0 to 2; n represents a number from 1 to 7; and in a case in which m is 2, the two $R^1$s may be the same or different.

2. A resin composition comprising an epoxy resin monomer, a novolac resin including a compound having a structural unit represented by the following Formula (I), and a filler;
wherein the filler comprises:
a first filler having a volume average particle diameter of not less than 0.01 μm and less than 1 μm;
a second filler having a volume average particle diameter of not less than 1 μm and less than 10 μm;
a third filler having a volume average particle diameter of from 10 μm to 50 μm, and containing an aluminum oxide particle; and
a fourth filler having a volume average particle diameter of from 20 μm to 100 μm, and containing a boron nitride particle;

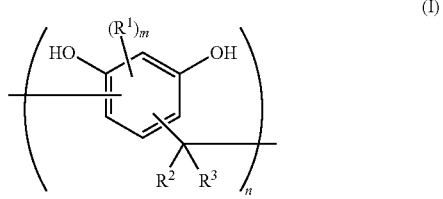

wherein in Formula (I), $R^1$ represents an alkyl group, an aryl group or an aralkyl group; each of $R^2$ and $R^3$ independently represents a hydrogen atom, an alkyl group, an aryl group or an aralkyl group; m represents a number from 0 to 2; n represents a number from 1 to 7; and in a case in which m is 2, the two $R^1$s may be the same or different.

3. The resin composition according to claim 2, wherein a total content of the third filler and the fourth filler is from 60% by volume to 98% by volume of a total volume of the fillers.

4. The resin composition according to claim 2, wherein a volume ratio of a content of the fourth filler to a content of the third filler is from 0.1 to 5.

5. The resin composition according to claim 1, wherein a content of the boron nitride particle is from 30% by volume to 90% by volume with respect to a total volume of the fillers.

6. The resin composition according to claim 1, wherein the novolac resin includes a phenolic compound constituting the novolac resin, and a content of the phenolic compound is from 5% by mass to 50% by mass.

7. The resin composition according to claim 1, wherein the novolac resin further contains a compound having a structural unit represented by the following Formula (II);

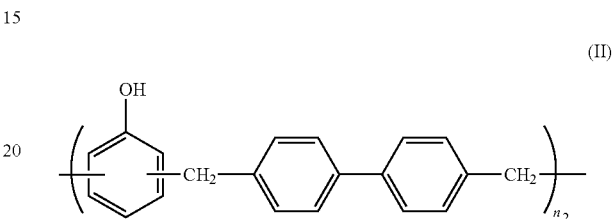

wherein in Formula (II), $n_2$ represents a number from 1 to 10.

8. A resin sheet which is a sheet-shaped product formed from the resin composition according to claim 1, the resin sheet having an average thickness of from 40 μm to 250 μm.

9. The resin sheet according to claim 8, the resin sheet being a layered product of a first resin layer formed from the resin composition according to claim 1, and a second resin layer formed from the resin composition according to claim 1.

10. The resin sheet according to claim 9, further comprising a metallic foil on or above one face of the layered product, and a protective film on or above another face of the layered product.

11. A cured resin sheet, the cured resin sheet being a heat-treated product of the resin sheet according to claim 8.

12. A resin sheet structure, comprising the resin sheet according to claim 8, and a metal plate or a radiator plate placed on or above at least one face of the resin sheet.

13. A cured resin sheet structure, the cured resin sheet structure being a heat-treated product of the resin sheet structure according to claim 12.

14. A method for producing a cured resin sheet structure, the method comprising:
producing a resin sheet structure by placing a metal plate or a radiator plate on or above at least one face of the resin sheet according to claim 8; and
curing the resin sheet by heating the resin sheet structure.

15. A semiconductor device, comprising:
a semiconductor element; and
the cured resin sheet according to claim 11 placed on the semiconductor element.

16. An LED device, comprising an LED element, the cured resin sheet according to claim 11 and a substrate, layered in this order.

* * * * *